(12) United States Patent
Hwang et al.

(10) Patent No.: US 10,304,541 B2
(45) Date of Patent: May 28, 2019

(54) MEMORY DEVICE

(71) Applicant: SAMSUNG ELECTRONICS CO., LTD., Suwon-si (KR)

(72) Inventors: Sun Gyung Hwang, Suwon-si (KR); Byoung Taek Kim, Hwaseong-si (KR); Yong Seok Kim, Suwon-si (KR); Ju Seok Lee, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 15/881,208

(22) Filed: Jan. 26, 2018

(65) Prior Publication Data
US 2018/0374540 A1    Dec. 27, 2018

(30) Foreign Application Priority Data

Jun. 26, 2017    (KR) .................. 10-2017-0080423

(51) Int. Cl.
| *G11C 16/10* | (2006.01) |
| *G11C 16/12* | (2006.01) |
| *G11C 16/08* | (2006.01) |
| *G11C 16/04* | (2006.01) |

(52) U.S. Cl.
CPC .............. *G11C 16/12* (2013.01); *G11C 16/08* (2013.01); *G11C 16/0483* (2013.01)

(58) Field of Classification Search
CPC ..... G11C 16/10; G11C 16/16; G11C 16/0416; H01L 27/115; H01L 27/11521
USPC ........................................ 365/185.05, 185.18
See application file for complete search history.

(56) References Cited

U.S. PATENT DOCUMENTS

| 6,522,583 | B2 | 2/2003 | Kanda et al. |
| 7,411,827 | B2 | 8/2008 | Guterman et al. |
| 7,796,430 | B2 | 9/2010 | Lutze et al. |
| 7,894,263 | B2 | 2/2011 | Lee et al. |
| 8,102,711 | B2 | 1/2012 | Maejima |
| 8,238,153 | B2 | 8/2012 | Lee |
| 8,531,886 | B2 | 9/2013 | Huang et al. |
| 8,755,232 | B2 | 6/2014 | Huang et al. |
| 8,842,479 | B2 | 9/2014 | Huang et al. |
| 8,947,939 | B2 | 2/2015 | Tsai et al. |
| 8,976,581 | B2 | 3/2015 | Tsai et al. |
| 9,171,636 | B2 | 10/2015 | Chang et al. |

(Continued)

FOREIGN PATENT DOCUMENTS

| JP | 5385435 B1 | 1/2014 |
| KR | 10-0591772 B1 | 6/2006 |

*Primary Examiner* — Son T Dinh
(74) *Attorney, Agent, or Firm* — Sughrue Mion, PLLC

(57) ABSTRACT

A memory device includes a memory cell array including a first switch cell, a second switch cell, and a plurality of memory cells disposed between the first the second switch cells and connected to a plurality of word lines, and a control circuit configured to perform a program operation by providing a program voltage to a first word line among the plurality of word lines, a switch voltage to a second word line among the plurality of word lines, and a pass voltage to remaining word lines among the plurality of word lines, wherein the control circuit is configured to turn off the first switch cell and the second switch cell in a first section of the program operation, and configured to turn on the first switch cell and increase the switch voltage in a second section of the program operation later than the first section.

20 Claims, 21 Drawing Sheets

(56) References Cited

U.S. PATENT DOCUMENTS

2009/0003061 A1* 1/2009 Helm .................. G11C 16/0483
　　　　　　　　　　　　　　　　　　　　　365/185.05
2010/0124118 A1* 5/2010 Lee .................... G11C 11/5621
　　　　　　　　　　　　　　　　　　　　　365/185.17
2014/0022845 A1 1/2014 Oishi et al.

* cited by examiner

MEMORY DEVICE

CROSS-REFERENCE TO RELATED APPLICATION

This application claims priority from Korean Patent Application No. 10-2017-0080423 filed on Jun. 26, 2017 in the Korean Intellectual Property Office, the disclosure of which is incorporated herein by reference in its entirety.

BACKGROUND

1. Field

Devices and apparatuses consistent with example embodiments relate to a memory device.

2. Description of Related Art

Among memory devices, a flash memory device is a nonvolatile memory, and has the characteristic of retaining data having been stored therein, even if a power supply thereto is interrupted. Due to this characteristic, flash memory devices are widely used as a storage device in various electronic devices such as smartphones, digital cameras, solid state drives (SSD), laptop computers, tablet personal computers (PCs), and the like. As the range of applications of the flash memory devices has expanded to encompass a wider range of electronic devices, various techniques for efficiently operating flash memory devices and reducing the power consumption thereof are also being developed.

SUMMARY

One or more example embodiments may provide a memory device employing an efficient program method.

According to an aspect of an example embodiment, a memory device includes a memory cell array including a first switch cell, a second switch cell, and a plurality of memory cells, the plurality of memory cells disposed between the first switch cell and the second switch cell and connected to a plurality of word lines; and a control circuit configured to perform a program operation by providing a program voltage to a first word line among the plurality of word lines, a switch voltage to a second word line among the plurality of word lines, and a pass voltage to remaining word lines among the plurality of word lines, wherein the control circuit is configured to turn off the first switch cell and the second switch cell in a first section of the program operation, and configured to turn on the first switch cell and increase the switch voltage in a second section of the program operation later than the first section.

According to an aspect of another example embodiment, a memory device includes a first switch cell connected to a first select line; a second switch cell connected to a second select line; a plurality of memory cells connected to each other in series between the first switch cell and the second switch cell, and connected to a plurality of word lines; and a control circuit configured to perform a program operation with respect to a program memory cell among the plurality of memory cells, wherein the control circuit is configured to sequentially provide a turn-on voltage to each of the first select line and a switch word line among the plurality of word lines during the program operation, the switch word line being connected to a switch memory cell adjacent to the program memory cell.

According to an aspect of another example embodiment, a memory device includes a channel region extended in a direction perpendicular to an upper surface of a semiconductor substrate; a plurality of word lines stacked on the semiconductor substrate to surround the channel region, and including a program word line and a switch word line located above the program word line; a ground select line between the plurality of word lines and the semiconductor substrate; a string select line above the plurality of word lines; and a control circuit configured to boost a voltage of the channel region located in each of an upper portion and a lower portion of the switch word line by providing a ground voltage to the ground select line and the string select line, providing a program voltage to the program word line, providing a switch voltage at a first level to the switch word line, and providing a pass voltage to remaining word lines of the plurality of word lines, wherein the control circuit is configured to perform a program operation with respect to a memory cell connected to the program word line by increasing the switch voltage to a second level higher than the first level, after a voltage of the string select line is increased.

BRIEF DESCRIPTION OF DRAWINGS

The above and other aspects, features and other advantages will be more clearly understood from the following detailed description, taken in conjunction with the accompanying drawings, in which.

DETAILED DESCRIPTION

Example embodiments will now be described in detail with reference to the accompanying drawings.

Figure 1:
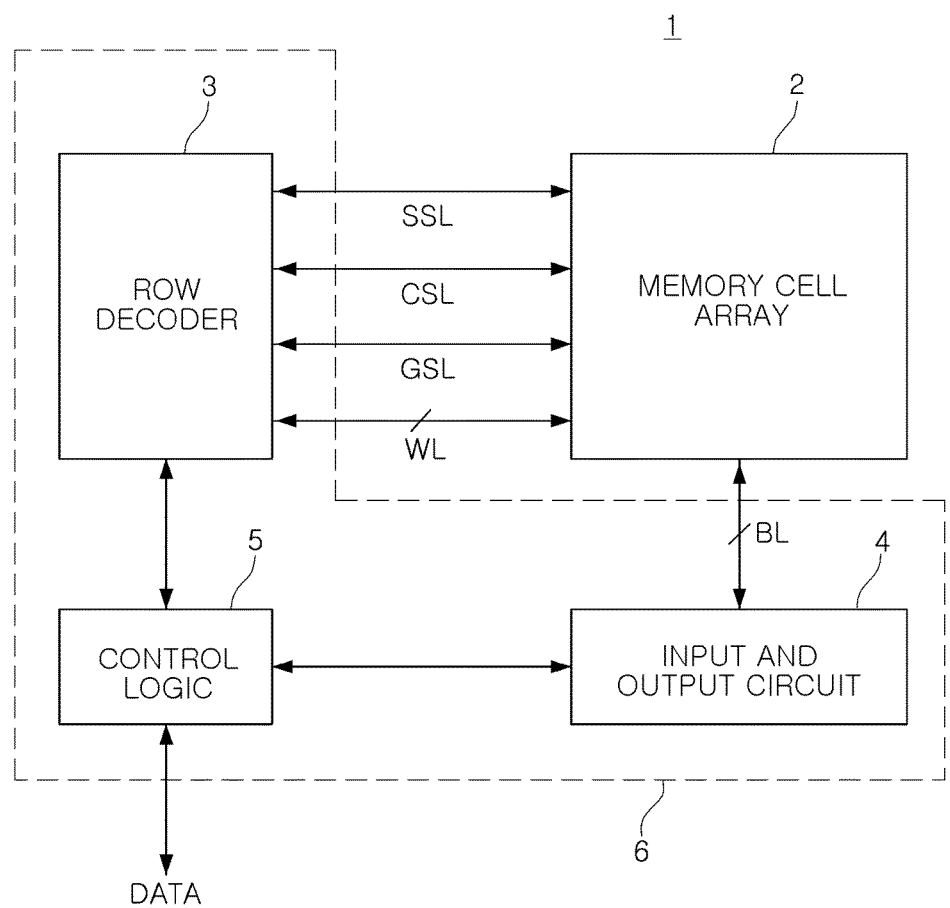
FIG. 1 is a block diagram schematically illustrating a memory device according to an example embodiment.

FIG. 1 is a block diagram schematically illustrating a memory device according to an example embodiment.

Referring to FIG. 1, a memory device 1 according to an example embodiment may include a memory cell array 2, a row decoder 3, and a core logic circuit 6. The core logic circuit 6 may include an input and output circuit 4 and a control circuit (or control logic) 5.

The memory cell array 2 may include a plurality of memory cells arranged in a plurality of rows and columns. In an example embodiment, the memory cell array 2 may include a plurality of memory cell strings, and each of the plurality of memory cell strings may include a plurality of memory cells connected to each other in series, and a first switch cell and a second switch cell respectively connected to both ends of the plurality of memory cells. In an example embodiment, the first switch cell and the second switch cell may be a string select transistor and a ground select transistor, respectively.

Each of the plurality of memory cell strings may be connected to the row decoder 3 through a word line WL, a common source line CSL, a string select line SSL, a ground select line GSL, and the like, and may be connected to the input and output circuit 4 through a bit line BL. In an example embodiment, memory cells arranged in the same row are connected to the same word line WL, and memory cells included in a memory cell string are connected to the same bit line BL.

A plurality of memory cells included in the memory cell array 2 may be divided into a plurality of memory blocks. Each memory block may include a plurality of word lines WL, a plurality of string select lines SSL, a plurality of ground select lines GSL, a plurality of bit lines BL, and at least one common source line CSL.

The row decoder 3 may receive a control command from the control circuit 5, and, in an example embodiment, the control command may include address information. The row decoder 3 may determine a voltage to be supplied to at least a portion of the word line WL, the common source line CSL, the string select line SSL, and the ground select line GSL connected to the memory cell array 2 according to the address information.

The input and output circuit 4 may select at least a portion of the bit line BL connected to the memory cell array 2 according to a control command received from the control circuit 5. The input and output circuit 4 may read data stored in a memory cell connected to the bit line BL having been selected, and/or may write data to a memory cell connected to the bit line BL having been selected. The input and output circuit 4 may include a circuit such as a page buffer, an input and output buffer, a data latch, and the like, to perform an operation described above.

The control circuit 5 may control operations of the row decoder 3 and the input and output circuit 4 by transmitting and/or receiving data DATA to/from an external host, and the like, during communication. When the data stored in the memory cell array 2 is to be read, the control circuit 5 may control an operation of the row decoder 3 to supply a voltage for a read operation to a word line WL in which data to be read is stored. When the voltage for a read operation is supplied to a specific word line WL, the control circuit 5 may control the input and output circuit 4 to read data from a memory cell connected to the specific word line WL to which the voltage for a read operation is supplied.

When data is to be written to the memory cell array 2, the control circuit 5 may control an operation of the row decoder 3 to supply a voltage for a write operation to a word line WL to which data is to be written. When the voltage for a write operation is supplied to a specific word line WL, the control circuit 5 may control the input and output circuit 4 to write data to a memory cell connected to the specific word line WL to which the voltage for a write operation is supplied.

Figure 2A:
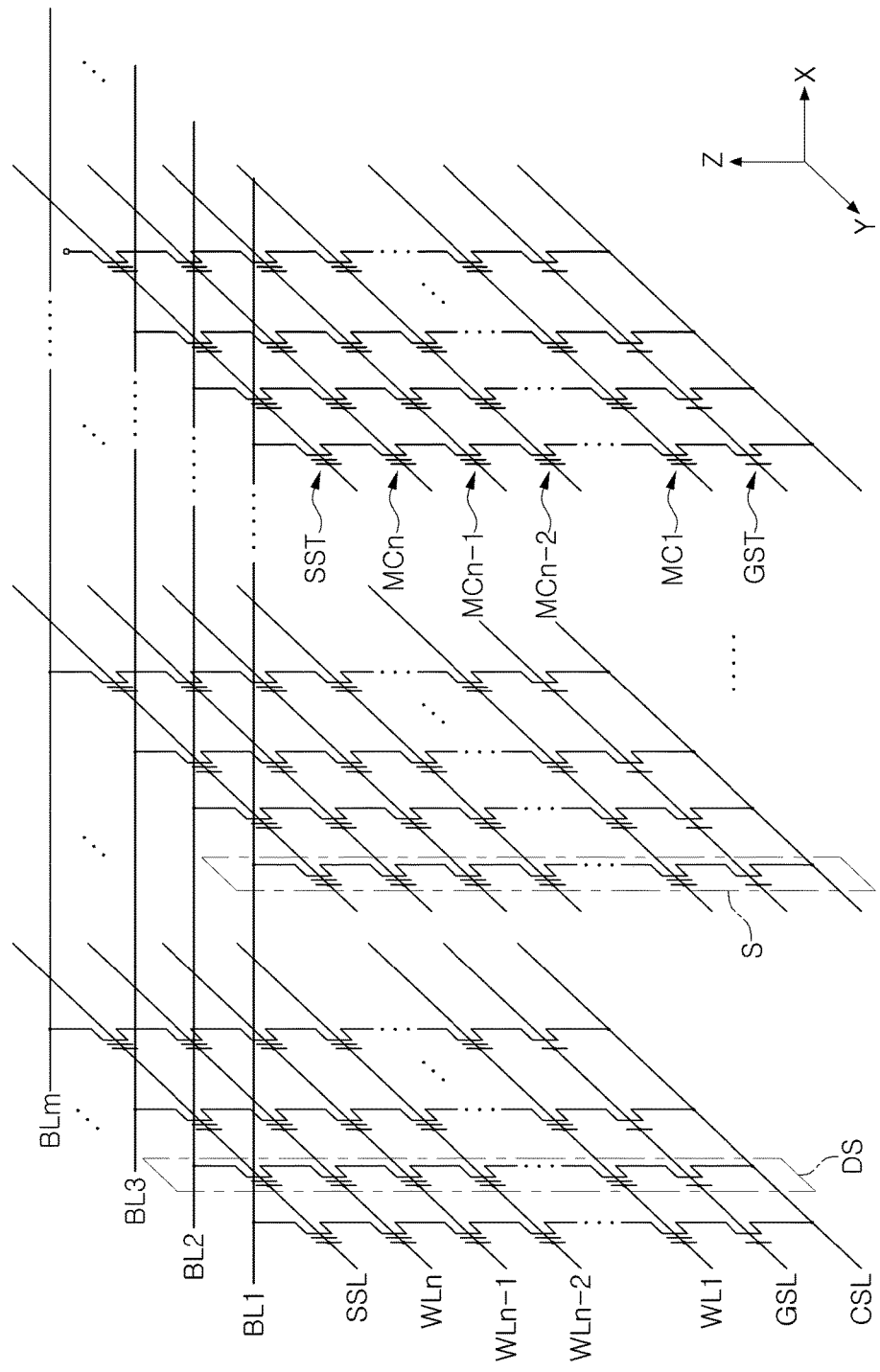
FIGS. 2A and 2B are circuit diagrams schematically illustrating a memory cell array included in a memory device according to an example embodiment.
Figure 2B:
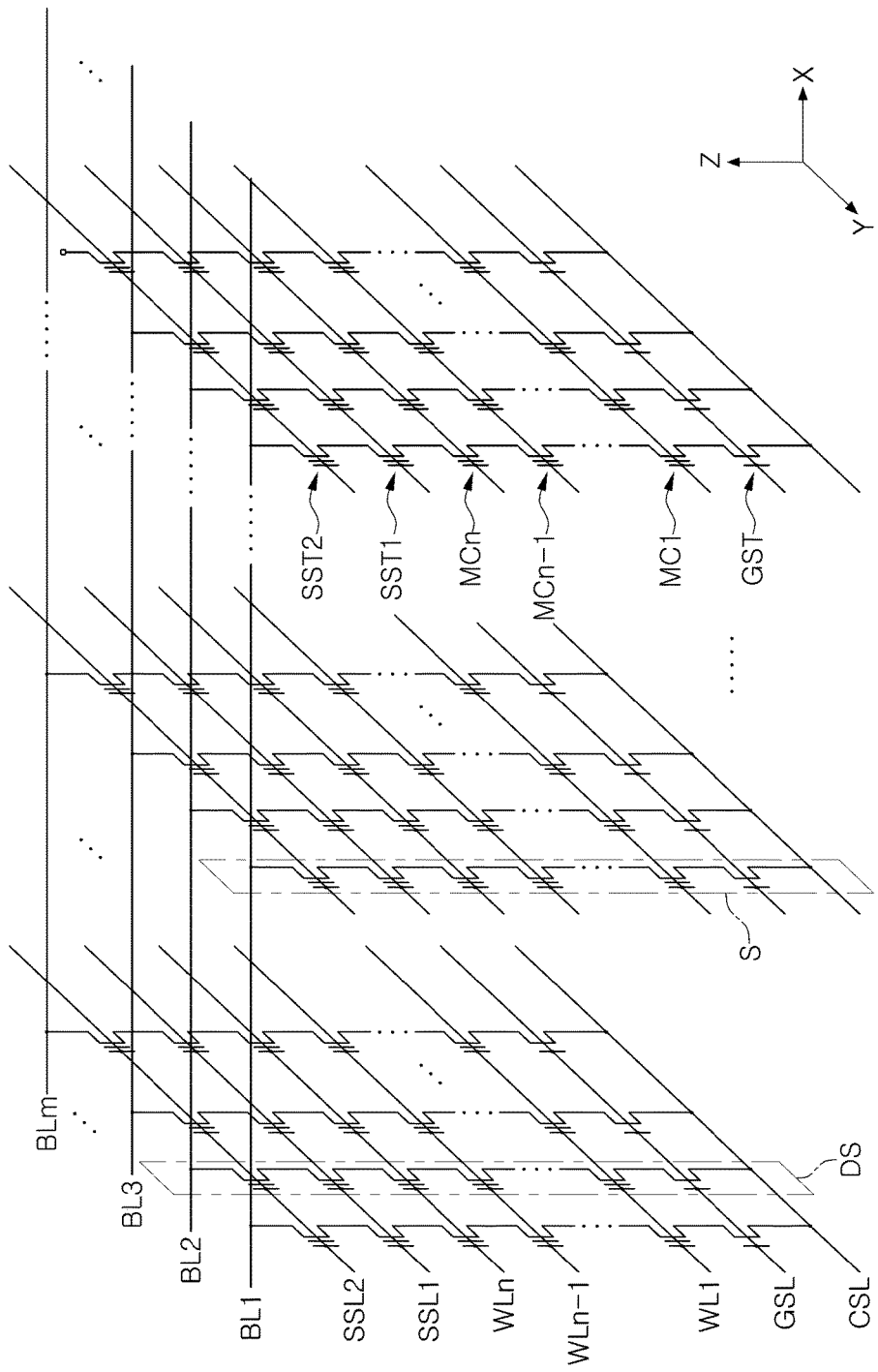

FIGS. 2A and 2B are circuit diagrams schematically illustrating a memory cell array included in a memory device according to an example embodiment.

The memory device according to an example embodiment may be a NAND flash memory device. Referring to FIG. 2A, a memory cell array may include a memory cell string S provided as a plurality of memory cell strings, including n number of memory cells MC1, . . . MCn−2, MCn−1, and MCn connected to each other in series, as well as a ground select transistor GST and a string select transistor SST respectively connected in series to both ends of the memory cells MC1 to MCn. The n number of memory cells MC1 to MCn connected to each other in series may be connected to n number of word lines WL1, . . . WLn−2, WLn−1, and WLn for selecting each of the memory cells MC1 to MCn, respectively. A dummy cell may be further disposed between the ground select transistor GST and a first memory cell MC1 as well as between the string select transistor SST and an n-th memory cell MCn.

A gate terminal of the ground select transistor GST is connected to the ground select line GSL, and a source terminal is connected to the common source line CSL. A gate terminal of the string select transistor SST is connected to the string select line SSL, and a source terminal is connected to a drain terminal of a memory cell MCn. Each of the string select transistor SST and the ground select transistor GST may be operated as a switch cell for selecting at least one of the memory cells MC1 to MCn, in operations such as programming, reading, erasing, and the like. In FIG. 2A, a structure in which one ground select transistor GST and one string select transistor SST are connected to the n memory cells MC1 to MCn, connected to each other in series is illustrated. Alternatively, a plurality of ground select transistors GST or a plurality of string select transistors SST may be connected thereto. In an example embodiment, referring to FIG. 2B, a single memory cell string S may include a first string select transistor SST1 and a second string select transistor SST2.

A drain terminal of the string select transistor SST may be connected to one of a plurality of bit lines BL1 to BLm. When a signal is applied to the gate terminal of the string select transistor SST through the string select line SSL, a signal applied to the bit lines BL1 to BLm is transmitted to the n number of memory cells MC1 to MCn, connected to each other in series, so that data read and write operations may be performed. In addition, a predetermined erase voltage may be applied through a well region formed in a substrate, so that an erase operation to erase data written on the memory cells MC1 to MCn may be executed.

Referring to FIGS. 2A and 2B, a memory device according to an example embodiment may include at least one dummy string DS. The dummy string DS may be a string including a dummy channel which is not connected to bit lines BL1 to BLm.

Figure 3:
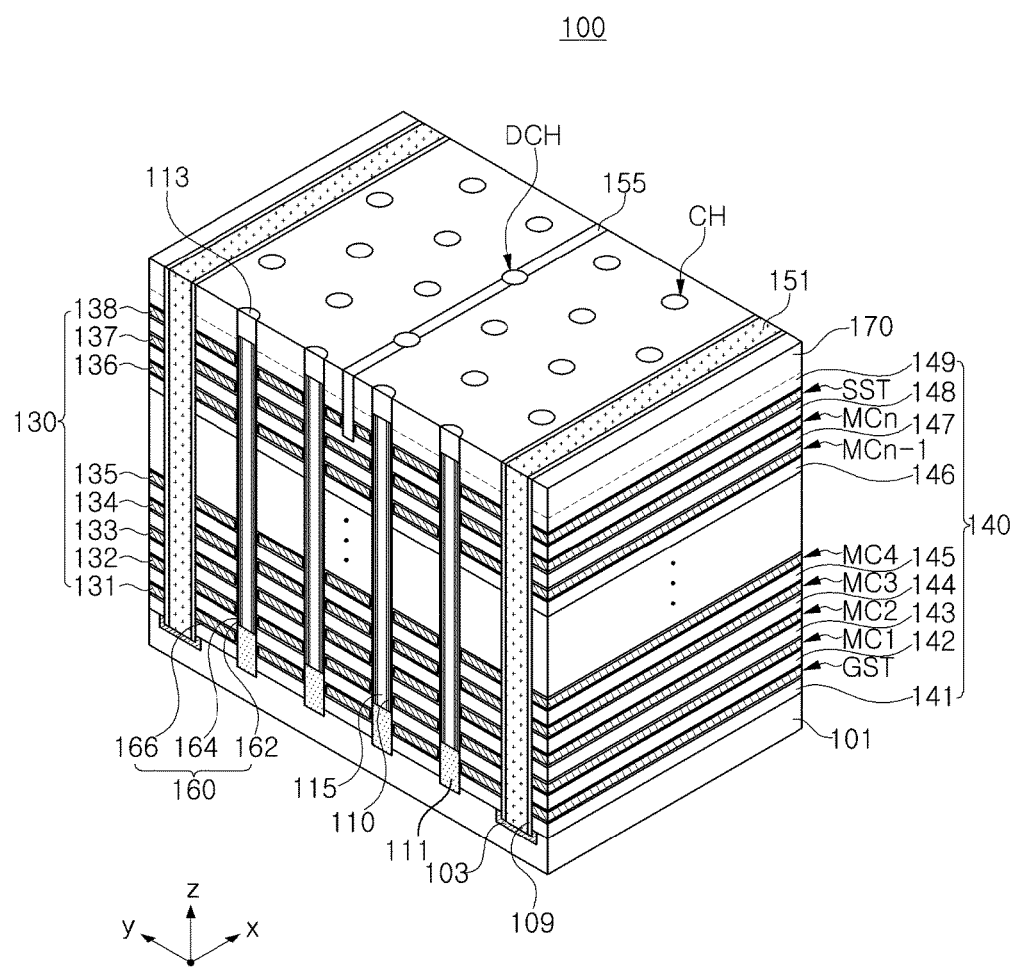
FIG. 3 is a perspective view illustrating a memory device according to an example embodiment.

FIG. 3 is a perspective view illustrating a memory device according to an example embodiment.

FIG. 3 is a perspective view illustrating a cell region of a memory device. Referring to FIG. 3, a memory device 100 according to an example embodiment may include a substrate 101, a plurality of channel structures CH and dummy channel structures DCH perpendicular to an upper surface (or an X-Y plane in an example embodiment illustrated in FIG. 3) of the substrate 101, and a plurality of gate electrode layers 130 (e.g., gate electrode layers 131, 132, 133, 134, 135, 136, 137, and 138) stacked on the substrate 101 to be adjacent to the channel structure CH. The plurality of gate electrode layers 130 may be alternately stacked with a plurality of insulating layers 140 (e.g., insulating layers 141, 142, 143, 144, 145, 146, 147, 148, and 149), and at least a portion of the plurality of gate electrode layers 130 may be divided into a plurality of gate electrode layers by an isolation insulating layer 155.

The plurality of gate electrode layers 130 may provide a first select line 131, a second select line 138, and a plurality of word lines 132 to 137. Each of the first select line 131 and the second select line 138 may provide the ground select transistor GST and the string select transistor SST together with the channel structure CH. The plurality of word lines 132 to 137 are disposed between the first select line 131 and the second select line 138, and may provide the plurality of memory cells MC1 to MCn together with the channel structure CH.

The plurality of gate electrode layers 130 may be divided into a plurality of regions by a common source line 151. The common source line 151 may be including an insulating material such as a metal, a metal compound, polysilicon, or the like, and may be electrically connected to a source region 103 formed in the substrate 101. The source region 103 may be provided as a source region of the ground select transistor GST. In a side surface of the common source line 151, a spacer 109 for electrically separating the common source line 151 from the plurality of gate electrode layers 130 may be formed therein.

The plurality of channel structures CH and dummy channel structures DCH may be extended in a direction (or a Z-axis direction in an example embodiment illustrated in FIG. 3) perpendicular to the upper surface of the substrate 101. Each of the channel structures CH may include a channel region 110, an embedded insulating layer 115 filling a space inside the channel region 110, a drain region 113 prepared above the channel region 110, a gate insulating layer 160 prepared between the channel region 110 and the gate electrode layers 130, and the like. The gate insulating layer 160 may include a tunneling layer 162, a charge storage layer 164, a blocking layer 166, and the like, and at least a portion of the gate insulating layer 160 may be provided to have a shape surrounding the gate electrode layers 130. According to an example embodiment, the channel region 110 may have a columnar shape, such as a cylindrical shape or a prismatic shape, and may not include the embedded insulating layer 115. In addition, each channel structure CH may have an inclined side surface which narrows toward the substrate 101 according to an aspect ratio.

The plurality of channel structures CH and dummy channel structures DCH may be disposed separately from each other on an X-Y plane. The number and arrangement of the plurality of channel structures CH and dummy channel structures DCH may vary according to an example embodiment. For example, the plurality of channel structures CH and dummy channel structures DCH may be disposed in the form of a zig-zag in at least one direction. In an example embodiment illustrated in FIG. 3, the plurality of channel structures CH are symmetrically arranged with the isolation insulating layer 155 interposed therebetween, and the plurality of dummy channel structures DCH are illustrated as passing through the isolation insulating layer 155, but an example embodiment is not limited to such a form.

The channel region 110 may be electrically connected to the substrate 101 through an epitaxial layer 111 in a lower portion of the memory device 100. The channel region 110 may include a semiconductor material such as polysilicon or single crystal silicon, and the semiconductor material may be a material which is not doped with an impurity or may include a P-type or N-type impurity. The epitaxial layer 111 may be a layer that grows using a selective epitaxy growth (SEG) process. The epitaxial layer 111 may have a form in which the epitaxial layer penetrates into the substrate 101 to a predetermined depth, as illustrated in FIG. 3.

The plurality of dummy channel structures DCH may have a structure similar to the channel structure CH. In other words, the plurality of dummy channel structures DCH may include the drain region 113, the channel region 110, and the embedded insulating layer 115, and may selectively include the epitaxial layer 111. However, the plurality of dummy channel structures DCH are electrically isolated from a bit line in an upper portion of a gate structure, which is different from the channel structure CH. Therefore, a program operation may not be executed in memory cells MC1 to MCn provided by the dummy channel structure DCH.

Figure 4:
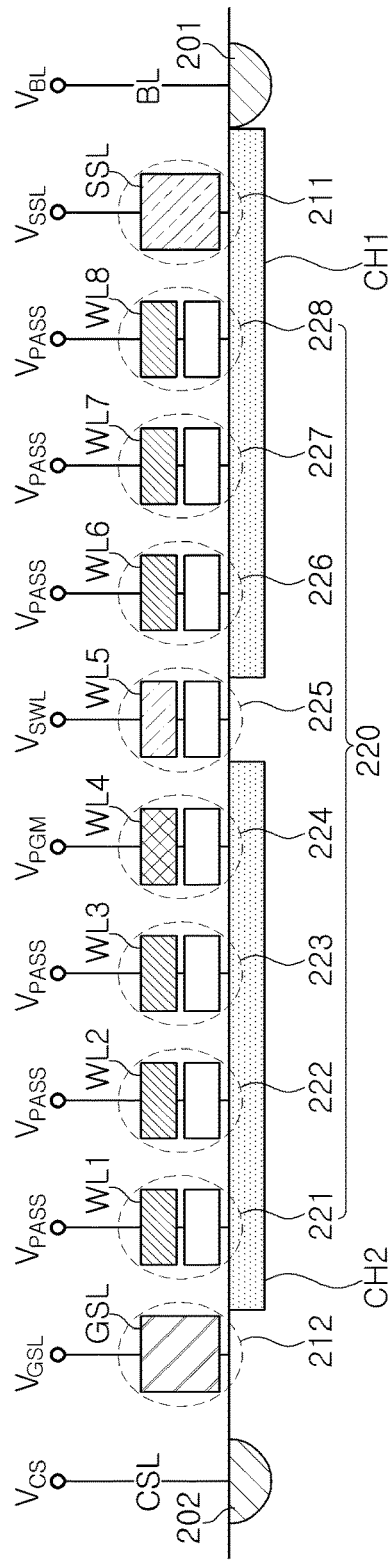
FIGS. 4 through 6 are drawings provided to illustrate operations of a memory device according to an example embodiment.
Figure 5:
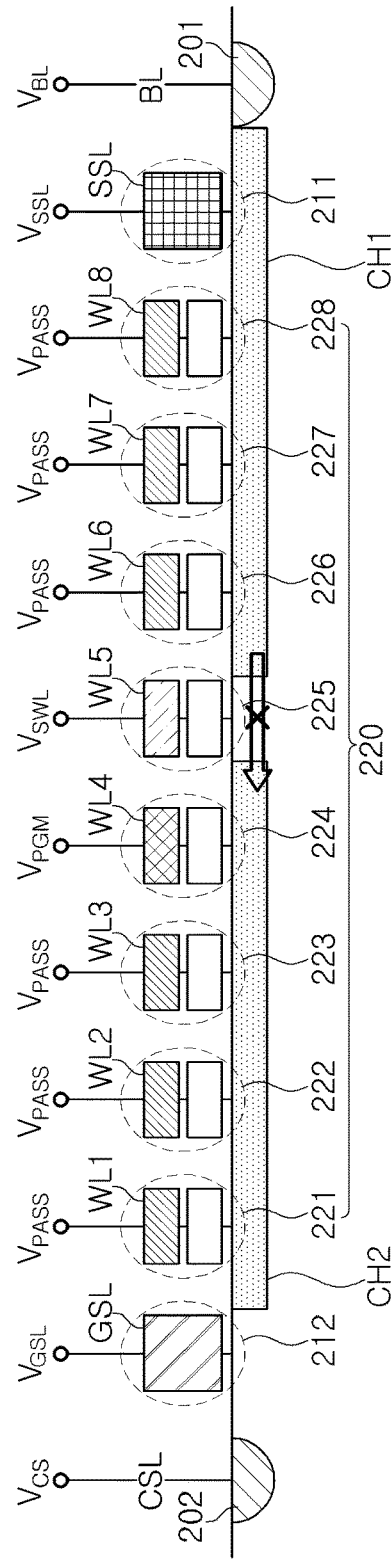
Figure 6:
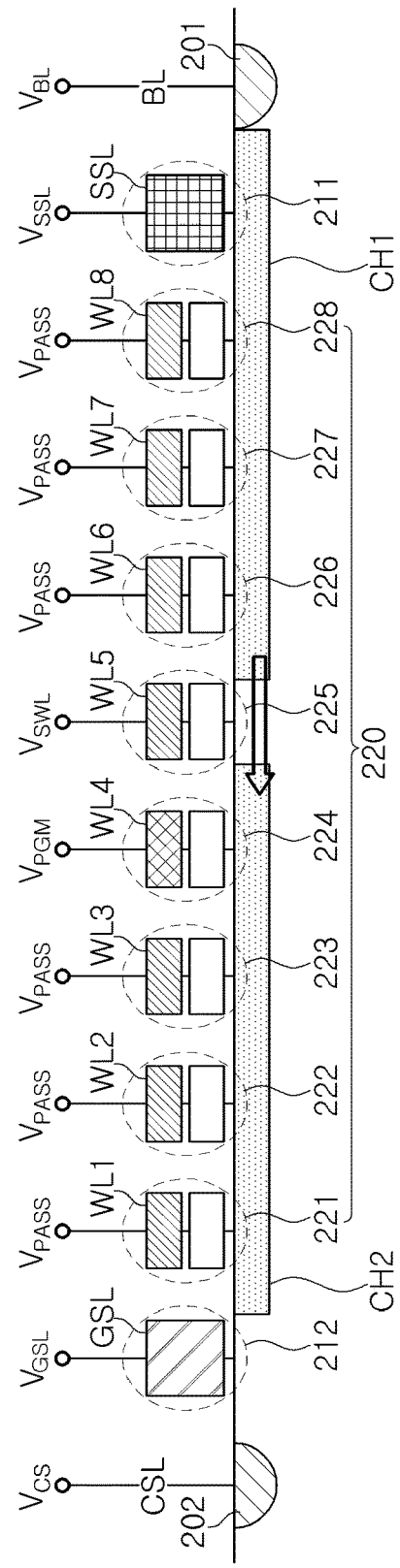

FIGS. 4 through 6 are drawings provided to illustrate an operation of a memory device according to example embodiments.

An operation of a memory device illustrated with reference to FIGS. 4 through 6 may be a program operation for writing data to a specific memory cell, and operations according to example embodiments illustrated in FIGS. 4 through 6 may be sequentially performed during execution of a program operation.

A program operation illustrated with reference to FIGS. 4 through 6 may be executed by a control circuit connected through a memory cell string, word lines WL1, WL2, WL3, WL4, WL5, WL6, WL7, and WL8, a string select line SSL, a ground select line GSL, a common source line CSL, and a bit line BL. Referring to FIGS. 4 through 6, a memory device according to an example embodiment may include the memory cell string, and the memory cell string may include a first switch cell 211 and a second switch cell 212, as well as a plurality of memory cells 220 (e.g., memory cells 221, 222, 223, 224, 225, 226, 227, and 228) connected to each other in series between the first switch cell 211 and the second switch cell 212.

The first switch cell 211 may be connected to the bit line BL through a drain region 201, and the second switch cell 212 may be connected to the common source line CSL through a source region 202. A gate electrode of the first switch cell 211 may be provided by the string select line SSL, and a gate electrode of the second switch cell 212 may be provided by the ground select line GSL. In an example embodiment, the first switch cell 211 may be a string select transistor, and the second switch cell 212 may be a ground select transistor.

In example embodiments illustrated in FIGS. 4 through 6, the memory cell string is illustrated to include eight memory cells 220, which is only an example for convenience of explanation. The number of memory cells 220 may vary widely. A gate electrode of the plurality of memory cells 220 may be provided by a plurality of word lines WL1 to WL8. Thus, an operation of the plurality of memory cells 220 may be determined by a voltage input to the plurality of word lines WL1 to WL8.

When a program operation is executed in a memory device according to an example embodiment, a control circuit may allow the first switch cell 211 and the second switch cell 212 to be turned off. In an example embodiment, the control circuit may allow the first switch cell 211 to be turned off by inputting the same voltage, for example, a ground voltage, to the bit line BL and the string select line SSL. Similarly, the control circuit may allow the second switch cell 212 to be turned off by inputting the same voltage, for example, a ground voltage, to the common source line CSL and the ground select line GSL.

The control circuit may input a program voltage $V_{PGM}$ to a program word line WL4 connected to a program memory cell MC4 selected as a program target (or a target for programming), and may input a switch voltage $V_{SWL}$ to a switch word line WL5 adjacent to the program word line WL4. A pass voltage $V_{PASS}$ may be input to the remaining word lines WL1 to WL3 and WL6 to WL8 except for the program word line WL4 and the switch word line WL5. In an example embodiment, the pass voltage $V_{PASS}$ may have a value about 8 V to 10 V, and the program voltage $V_{PGM}$ may have a value of about 20 V, which is higher than the pass voltage $V_{PASS}$. The switch voltage $V_{SWL}$ may have a value lower than a threshold voltage $V_{TH}$ of the memory cells 220, for example, a value lower than 0 V.

As the first switch cell 211 and the second switch cell 212 are turned off and respective voltages are input to the word lines WL1 to WL8 as illustrated in FIG. 4, voltages of a first channel region CH1 and a second channel region CH2 that are defined relative to the switch word line WL5 may be boosted. In an example embodiment, the first channel region CH1 may be a channel region located between the switch word line WL5 and the first switch cell 211, and the second channel region CH2 may be a channel region located between the switch word line WL5 and the second switch cell 212. A voltage of each of the first channel region CH1 and the second channel region CH2 may increase by the same value as the pass voltage $V_{PASS}$.

Next, referring to an example embodiment illustrated in FIG. 5, the control circuit may allow the first switch cell 211 to be turned on in response to a voltage $V_{SSL}$ of the string select line SSL being increased to have a value higher than a threshold voltage of the first switch cell 211, after voltages of the first channel region CH1 and the second channel region CH2 are boosted. The control circuit may allow the second switch cell 212 to be maintained in a turned off state, and may allow voltages input to the word lines WL1 to WL8 to be maintained at the same value.

As the first switch cell 211 is turned on, a hot carrier may be generated in the first channel region CH1. However, the hot carrier generated in the first channel region CH1 may not move to the second channel region CH2, as a current path is blocked in a lower portion of the switch word line WL5. In other words, in an example embodiment illustrated in FIG. 5, a state in which a voltage lower than a threshold voltage of the memory cells 220 is input to the switch word line WL5 is maintained. Thus, a hot carrier generated in the first channel region CH1 may be prevented from moving to the second channel region CH2 and being trapped in a program memory cell 224 connected to the program word line WL4.

Next, referring to an example embodiment illustrated in FIG. 6, the control circuit may change a magnitude of the switch voltage $V_{WSL}$ input to the switch word line WL5, after the voltage $V_{SSL}$ of the string select line SSL is increased to have a value sufficiently higher than a threshold voltage of the first switch cell 211. In an example embodiment, the control circuit may increase the magnitude of the switch voltage $V_{SWL}$, which is maintained at a first level in example embodiments illustrated in FIGS. 4 and 5, to a second level that is higher than the first level. The first level may have a value lower than a threshold voltage of a switch memory cell 225 connected to the switch word line WL5, and the second level may be a value higher than the threshold voltage of the switch memory cell 225. For example, the first level may have a value lower than a ground voltage, and the second level may have a value the same as the pass voltage $V_{PASS}$. In other words, in a program operation according to example embodiments illustrated in FIGS. 4 through 6, a magnitude of a voltage input to each of the string select line SSL, the ground select line GSL, the common source line CSL, the bit line BL, and the word lines WL1 to WL8 may be as illustrated in Table 1.

TABLE 1

| Operation | $V_{BL}$ | $V_{SSL}$ | $V_{CS}$ | $V_{GSL}$ | $V_{PGM}$ | $V_{SWL}$ | $V_{PASS}$ |
|---|---|---|---|---|---|---|---|
| FIG. 4 | 0 | 0 | 0 | 0 | 19 | −2 | 9 |
| FIG. 5 | 0 | 3 | 0 | 0 | 19 | −2 | 9 |
| FIG. 6 | 0 | 3 | 0 | 0 | 19 | 9 | 9 |

Referring to Table 1, the control circuit allows the first switch cell 211 and the second switch cell 212 to be turned off in an operation according to an example embodiment illustrated in FIG. 4, inputs the program voltage $V_{PGM}$ of about 19 V to the program word line WL4, inputs the switch voltage $V_{SWL}$ of −2 V that is lower than the threshold voltage of the switch memory cell 225 to the switch word line WL5, and inputs the pass voltage $V_{PASS}$ of 9 V to the remaining word lines WL1 to WL3 and WL6 to WL8. Under voltage conditions described above, in the operation according to an example embodiment illustrated in FIG. 4, voltage boosting of the first channel region CH1 and the second channel region CH2 may occur.

When the voltage boosting of the first channel region CH1 and the second channel region CH2 is completed, in other words, when a predetermined time has elapsed while voltage conditions according to an example embodiment illustrated in FIG. 4 are maintained, the control circuit allows the voltage $V_{SSL}$ of the string select line SSL to be increased to about 3 V. In other words, when the voltage boosting of the first channel region CH1 and the second channel region CH2 is completed, the control circuit allows the voltage $V_{SSL}$ of the string select line SSL to be increased to have a value higher than a threshold voltage of the first switch cell 211, so that the first switch cell 211 may be turned on. An operation described above may be represented by the control circuit inputting a first turn-on voltage to the string select line SSL. The first turn-on voltage may be defined as a value higher than the threshold voltage of the first switch cell 211. As the first switch cell 211 is turned on, a hot carrier may be generated in the first channel region CH1.

After the voltage $V_{SSL}$ of the string select line SSL is increased to the first turn-on voltage, the control circuit may increase the switch voltage $V_{SWL}$. In an example embodiment, the control circuit may increase the switch voltage $V_{SWL}$ to a second turn-on voltage, which has a value higher than the threshold voltage of the switch memory cell 225. For example, the switch voltage $V_{SWL}$ may be increased to the pass voltage $V_{PASS}$. In other words, through operations according to respective example embodiments illustrated in FIGS. 5 and 6, the control circuit may sequentially input the first turn-on voltage and the second turn-on voltage to the string select line SSL and the switch word line WL5, respectively. However, the first turn-on voltage input to the string select line SSL may be different from the second turn-on voltage input to the switch word line WL5.

As the switch voltage $V_{SWL}$ is increased to have a value higher than the threshold voltage of the switch memory cell 225, the hot carrier generated in the first channel region CH1 moves to the second channel region CH2, so that a current may flow. The hot carrier that moves to the second channel region CH2 may be trapped in a charge storage layer of the program memory cell 224 by the program word line WL4 to which the program voltage $V_{PGM}$ that has a relatively high value is input. Thus, a threshold voltage of the program memory cell 224 may be changed, and a program operation for the program memory cell 224 may be performed.

Figure 7:
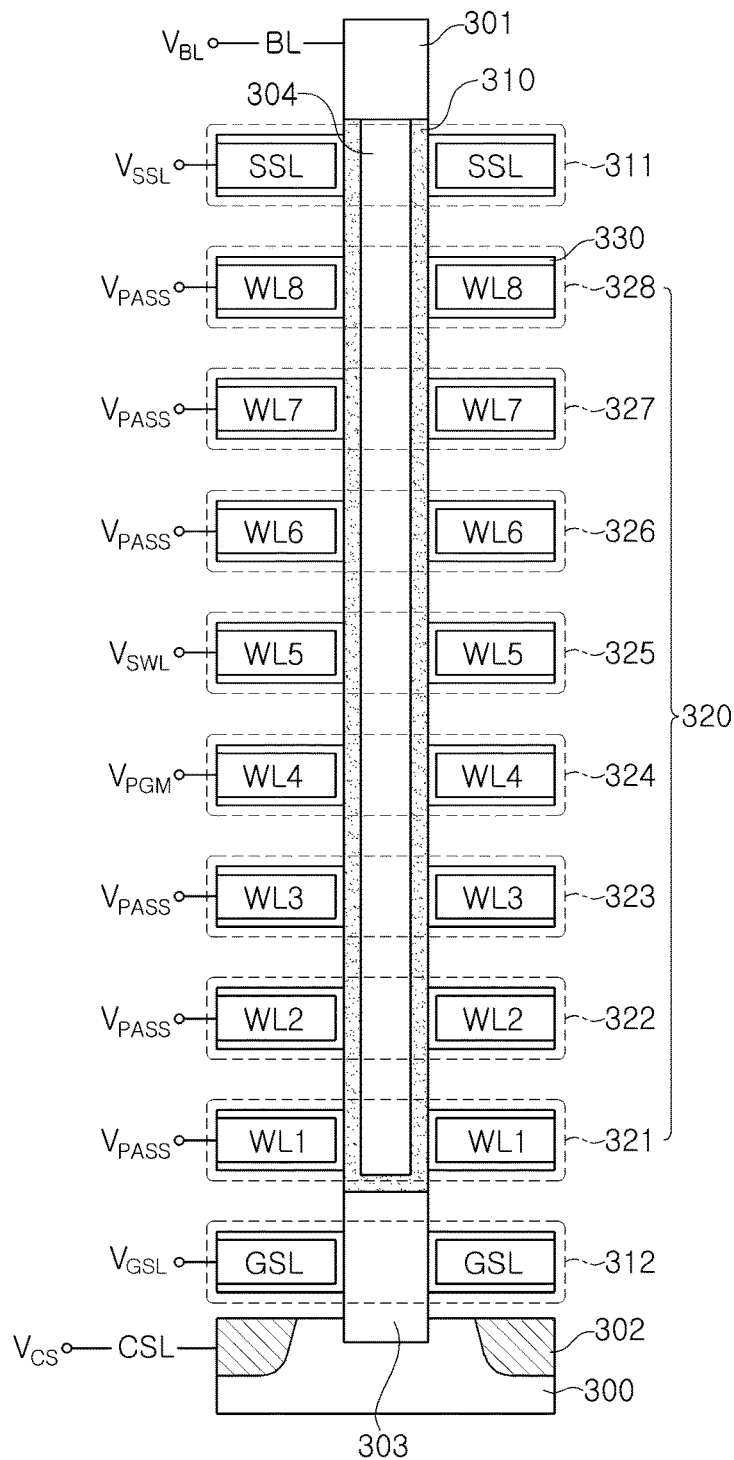
FIGS. 7 through 9 are drawings provided to illustrate operations of a memory device according to an example embodiment.
Figure 8:
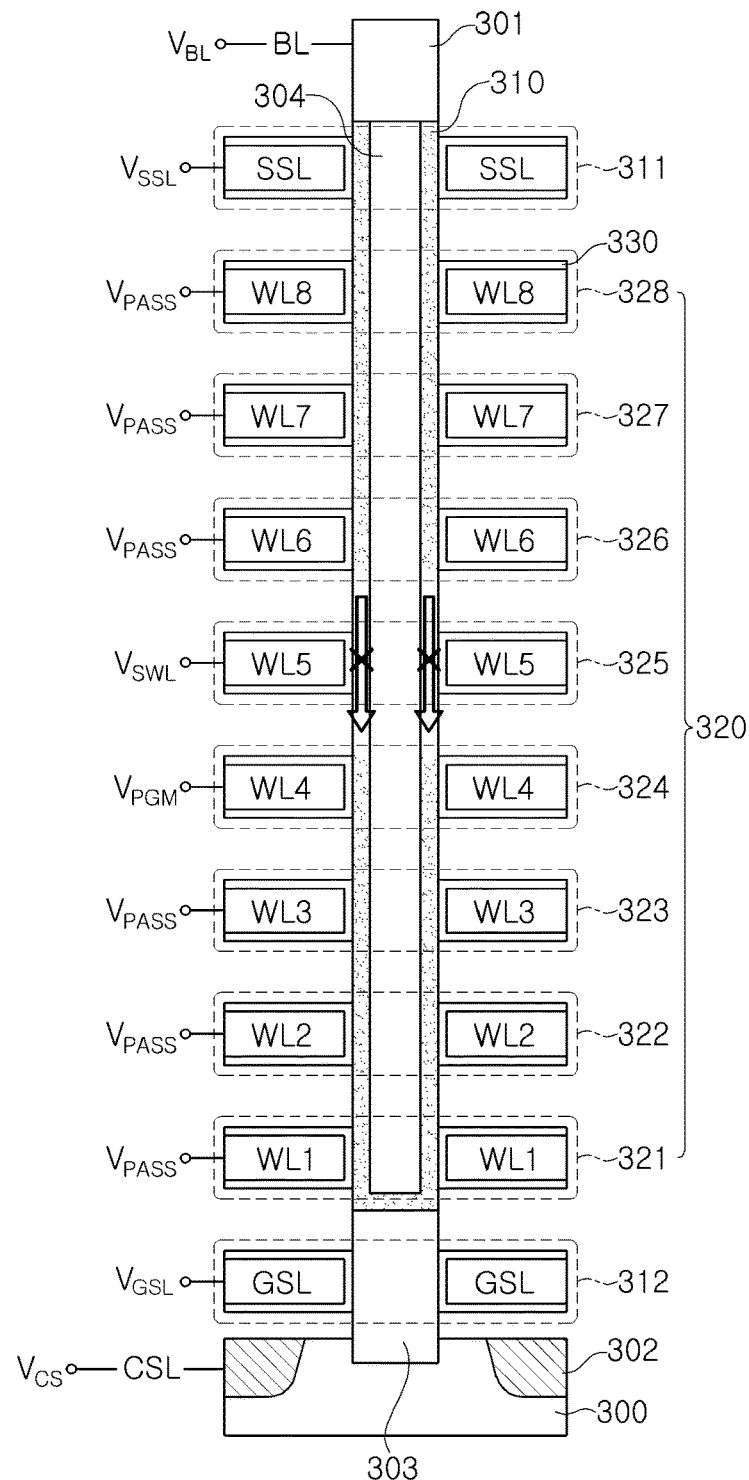
Figure 9:
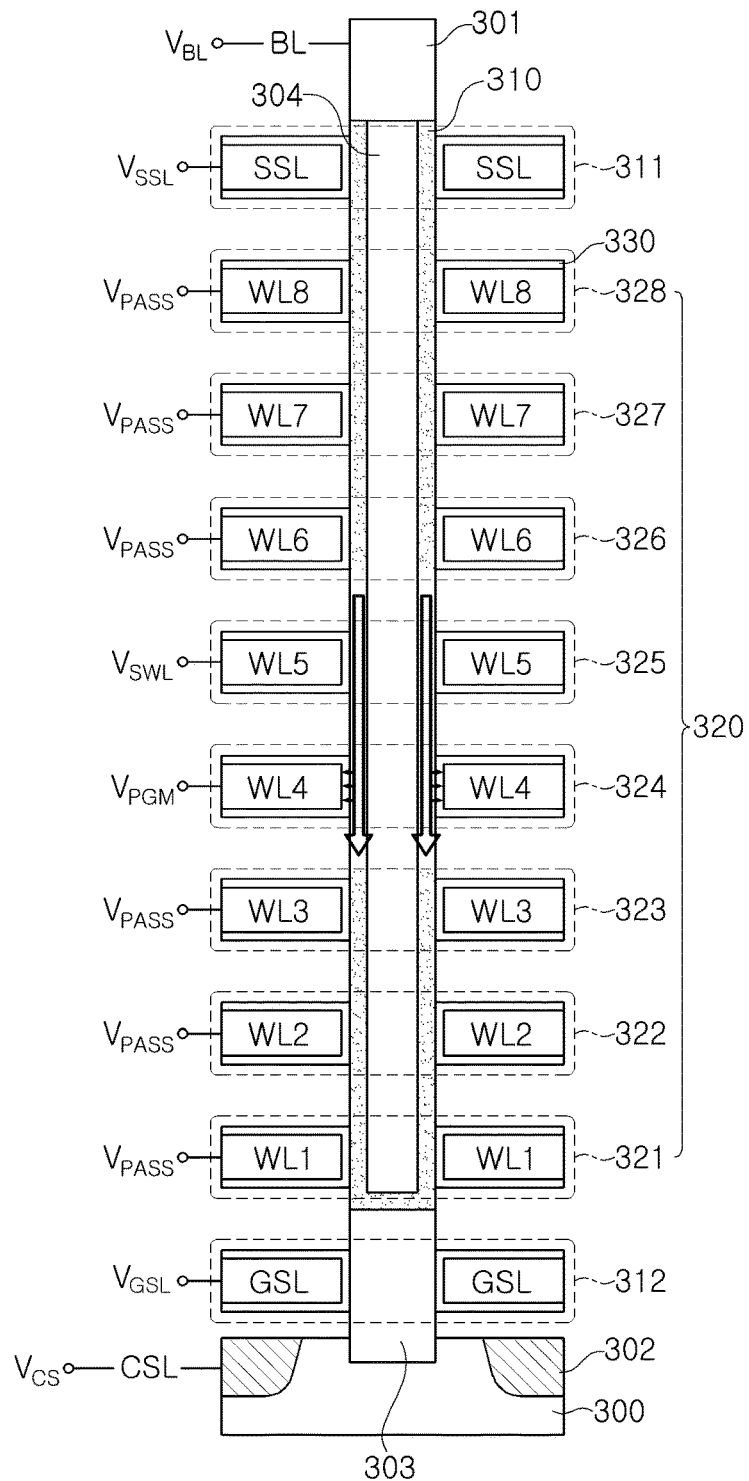

FIGS. 7 through 9 are drawings provided to illustrate an operation of a memory device according to example embodiments.

In example embodiments, a memory device illustrated with reference to FIGS. 7 through 9 may include a channel region 310 extended in a direction perpendicular to an upper surface of a substrate 300. In other words, an operation illustrated in example embodiments illustrated in FIGS. 7 through 9 may be a program operation for writing data to a specific memory cell, and may be applied to a vertical type memory device. During execution of the program operation, an operation according to an example embodiment illustrated in FIGS. 7 through 9 may be sequentially performed.

Referring to FIGS. 7 through 9, a memory device according to an example embodiment may include the channel region 310 extended in a direction perpendicular to an upper surface of the substrate 300, a plurality of word lines WL1, WL2, WL3, WL4, WL5, WL6, WL7, and WL8 formed to be adjacent to the channel region 310, the string select line SSL and the ground select line GSL respectively disposed at both ends of the word lines WL1 to WL8, and the like. In an example embodiment, the ground select line GSL may be formed to be adjacent to an epitaxial layer 303 rather than the channel region 310. Thus, a ground select transistor 312 may have a structure different from a string select transistor 311 and memory cells 320 (e.g., memory cells 321, 322, 323, 324, 325, 326, 327, and 328). The memory cells 320 may be connected in series between the string select transistor 311 and the ground select transistor 312. In example embodiments illustrated in FIGS. 7 through 9, eight memory cells 320 are illustrated as being connected between the string select transistor 311 and the ground select transistor 312, which is only an example for convenience of explanation. The number of the memory cells 320 may be variously modified.

A drain region 301 including a conductive material may be formed above the channel region 310, and a source region 302 doped with an impurity may be formed in the substrate 300. Each of the drain region 301 and the source region 302 may be connected to the bit line BL and the common source line CSL, respectively.

When a program operation according to an example embodiment is executed, the control circuit may allow the string select transistor 311 and the ground select transistor 312 to be turned off. The control circuit may input the program voltage $V_{PGM}$ to the program word line WL4 connected to a program memory cell 324 that is selected as a program target, and may input the switch voltage $V_{SWL}$ to the switch word line WL5 adjacent to the program word line WL4. The pass voltage $V_{PASS}$ may be input to the remaining word lines WL1 to WL3 and WL6 to WL8 except for the program word line WL4 and the switch word line WL5. In an example embodiment, the pass voltage $V_{PASS}$ may have a value about 8 V through 10 V, and the program voltage $V_{PGM}$ may have a value about 20 V that is higher than the pass voltage $V_{PASS}$. The switch voltage $V_{SWL}$ may have a value lower than the threshold voltage $V_{TH}$ of the memory cells 320, and may have, for example, a value lower than 0 V.

As the string select transistor 311 and the ground select transistor 312 are turned off, and respective voltages are input to the word lines WL1 to WL8, as illustrated in FIG. 7, voltages of the channel region 310 may be boosted in an upper portion and a lower portion of the switch word line WL5. When the voltages of the channel region 310 are boosted in the upper portion and the lower portion of the switch word line WL5, the control circuit increases the voltage $V_{SSL}$ of the string select line SSL to have a value higher than a threshold voltage of the string select transistor 311, so that the string select transistor 311 may be turned on.

As the string select transistor 311 is turned on, a hot carrier may be generated in the channel region 310 located in an upper portion of the switch word line WL5. In this case, as in an example embodiment illustrated in FIG. 8, the control circuit allows the switch voltage $V_{SWL}$ input to the switch word line WL5 to be maintained at a value lower than a threshold voltage $V_{TH}$ of a fifth memory cell 325, so that the hot carrier is prevented from moving to the channel region 310 adjacent to the program word line WL4.

Next, referring to an example embodiment illustrated in FIG. 9, the control circuit increases a magnitude of the switch voltage $V_{SWL}$ input to the switch word line WL5 to have a value higher than the threshold voltage of the fifth memory cell 325, after the string select transistor 311 is completely turned on. Thus, as illustrated in FIG. 9, the hot carrier formed in the channel region 310 passes through the switch word line WL5, and the hot carrier may be trapped in a charge storage layer 330 of the program memory cell 324 by the program voltage $V_{PGM}$. As the hot carrier is trapped in the charge storage layer 330 of the program memory cell 324, the threshold voltage $V_{TH}$ of the program memory cell 324 may be changed, so a program operation for the program memory cell 324 may be completed.

Figure 10:
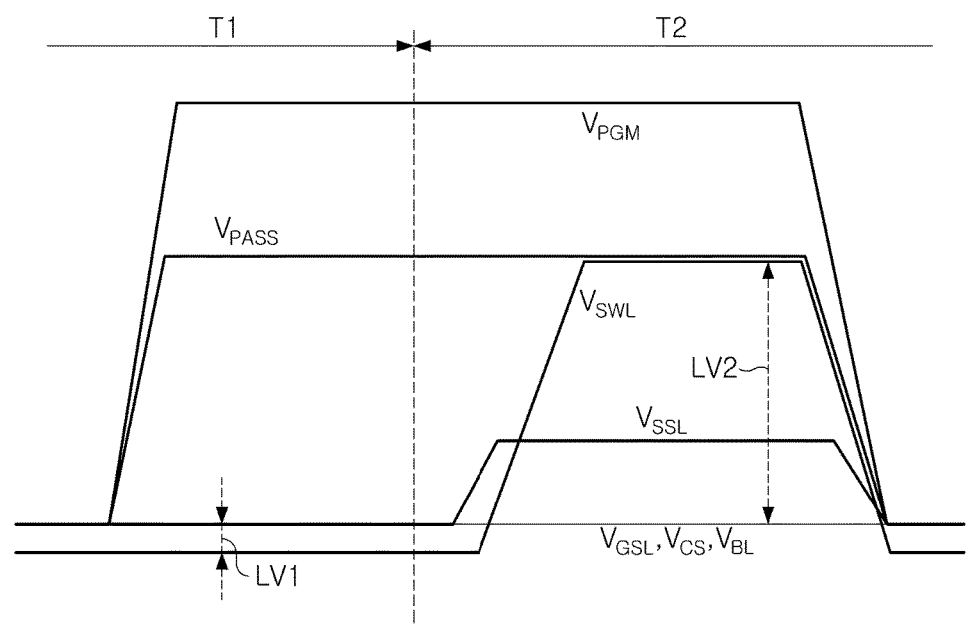
FIGS. 10, 11A, and 11B are graphs provided to illustrate operations of a memory device according to an example embodiment.
Figure 11A:
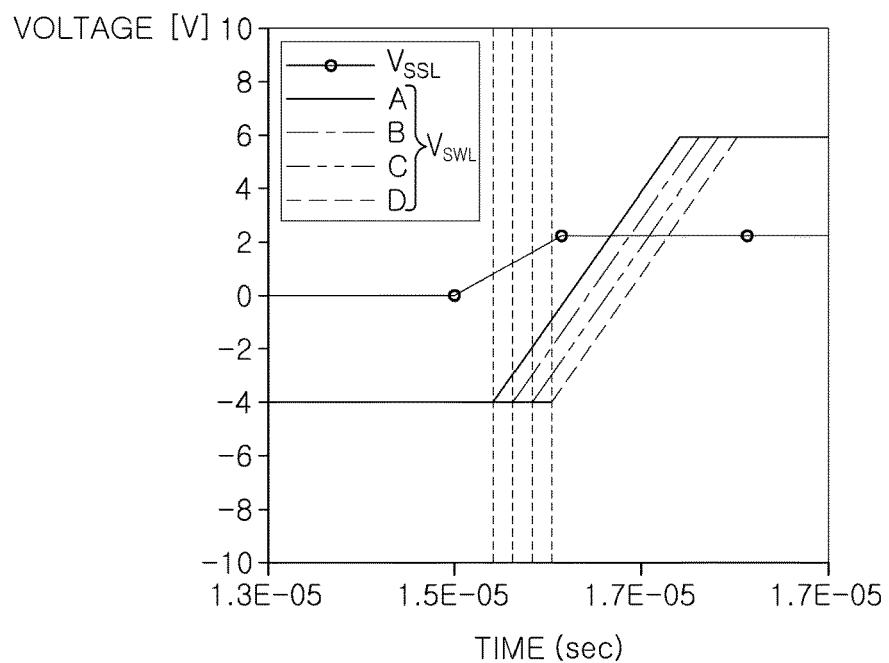
Figure 11B:
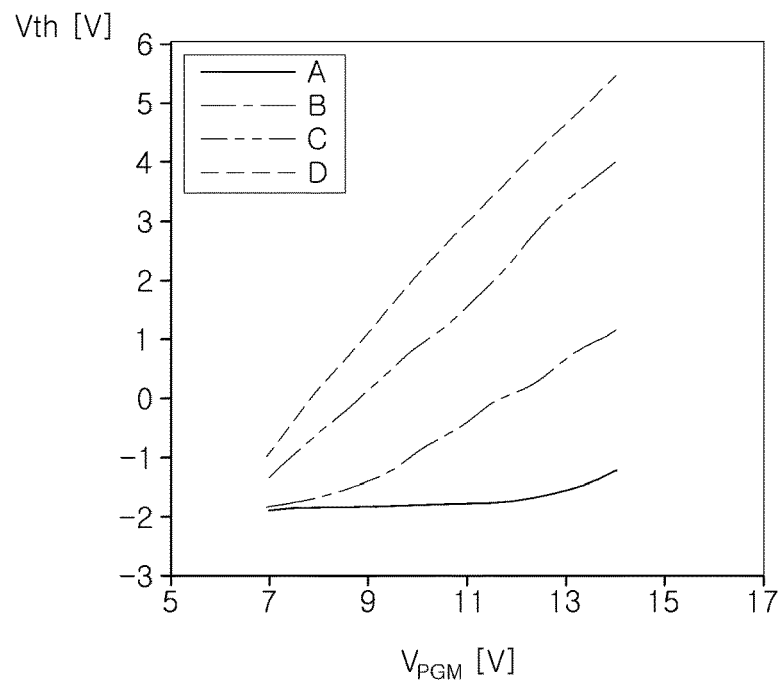

FIGS. 10, 11A, and 11B are graphs provided to illustrate an operation of a memory device according to example embodiments. Hereinafter, for convenience of explanation, descriptions will be made with reference to the example embodiments illustrated in FIGS. 4 through 6 as well.

Referring to FIG. 10, a program operation of a memory device according to an example embodiment may be executed over a first section (or first time interval) T1 and a second section (or second time interval) T2. The second section T2 may be a section following the first section T1. In an example embodiment, an operation according to an example embodiment illustrated in FIG. 4 may be executed during the first section T1, and operations according to example embodiments illustrated in FIGS. 5 and 6 may be executed during the second section T2.

Referring to FIG. 10, the program voltage $V_{PGM}$ and the pass voltage $V_{PASS}$ may maintain the same value during a period in the first section T1 and the second section T2, and the program voltage $V_{PGM}$ may be higher than the pass voltage $V_{PASS}$. The voltage $V_{GSL}$ of the ground select line GSL may be maintained at a ground voltage over the first section T1 and the second section T2.

The control circuit allows the first switch cell 211 connected to the string select line SSL and the second switch cell 212 connected to the ground select line GSL to be turned off, as the voltage $V_{SSL}$ of the string select line SSL and the voltage $V_{GSL}$ of the ground select line GSL are maintained at the ground voltage in the first section T1. In this case, the voltage $V_{BL}$ of the bit line BL and the voltage $V_{CS}$ of the common source line CSL may be maintained at the ground voltage.

The control circuit may maintain a magnitude of the switch voltage $V_{SWL}$ at a first level LV1 in the first section T1. Referring to FIG. 10, the first level LV1 may be lower than a threshold voltage of the switch memory cell 225. In an example embodiment, the first level may be lower than the ground voltage. As a minus voltage lower than the ground voltage is input to a switch word line SWL during the first section T1, voltages of the first channel region CH1 and the second channel region CH2 defined on both ends of the switch word line SWL may be boosted.

When the first section T1 is over and the second section T2 is started, the control circuit may increase the voltage $V_{SSL}$ of the string select line SSL. The voltage $V_{SSL}$ of the string select line SSL in the second section T2 may be increased to have a value higher than a threshold voltage of the first switch cell 211 connected to the string select line SSL. Thus, in the second section T2, the first switch cell 211 may be turned on. The control circuit maintains the magnitude of the switch voltage $V_{SWL}$ at the first level LV1 even while the first switch cell 211 is turned on. Thus, as the first switch cell 211 is turned on, a hot carrier generated in the first channel region CH1 may not move to the second channel region CH2.

When the first switch cell 211 is turned on, the control circuit may change the switch voltage $V_{SWL}$ to a second level LV2 that is higher than the first level LV1. The second level LV2 may be higher than the threshold voltage of the switch memory cell 225. In an example embodiment, the second level may be the same as the pass voltage $V_{PASS}$. The control circuit sets the switch voltage $V_{SWL}$ to the second level LV2, and thus allows a hot carrier generated in the first channel region CH1 to move to the second channel region CH2. The hot carrier moving to the second channel region CH2 moves to a charge storage layer of the program memory cell 224 by the program voltage $V_{PGM}$ which is relatively high. Thus, a program operation for the program memory cell 224 may be completed.

In an example embodiment, the control circuit inputs the program voltage $V_{PGM}$ to the program word line WL4 in a program operation, inputs the switch voltage $V_{SWL}$ to the switch word line WL5, and inputs the pass voltage $V_{PASS}$ to the remaining word lines WL1 to WL3 and WL6 to WL8. In addition, the control circuit allows the first switch cell 211 and the second switch cell 212 to be turned off in the first section T1 of a program operation, and sets a magnitude of the switch voltage $V_{SWL}$ to the first level LV1. When the second section T2 arrives after the first section T1, the control circuit allows the first switch cell 211 to be turned on, and increases a magnitude of the switch voltage $V_{SWL}$ to the second level LV2 that is higher than the first level LV1. By a series of operations described above, a program operation for the program memory cell 224 may be performed.

In detail, in an example embodiment, after the first switch cell 211 is completely turned on, the switch voltage $V_{SWL}$ is increased to the second level LV2. Thus, the probability of the generation of a hot carrier in the first channel region CH1 is increased, and a program operation may be performed based on the program voltage $V_{PGM}$ which is relatively low. Therefore, power consumption of the memory device may be lowered. In addition, interference with peripheral memory cells adjacent to the program memory cell 224 may be reduced. Hereinafter, it will be described in detail with reference to FIGS. 11A and 11B.

FIGS. 11A and 11B are graphs that are used to illustrate the relationship between the program voltage $V_{PGM}$ and the threshold voltage $V_{TH}$ depending on a difference between a rising point of the voltage $V_{SSL}$ of the string select line SSL and a rising point of the switch voltage $V_{SWL}$. In a graph illustrated in FIG. 11B, the threshold voltage $V_{TH}$ may be a threshold voltage of the program memory cell 224 after being programmed with the program voltage $V_{PGM}$. Referring to FIG. 11A, the voltage $V_{SSL}$ of the string select line SSL, and the switch voltage $V_{SWL}$ according to four comparative examples A to D are illustrated.

Referring to a graph illustrating a first comparative example A in FIG. 11A, a difference between a rising point of the voltage $V_{SSL}$ of the string select line SSL and the rising point of the switch voltage $V_{SWL}$ may be 0.3 µs. Referring to a graph illustrating the first comparative example A in FIG. 11B, when the program voltage $V_{PGM}$ of about 13 V is input, a change in the threshold voltage $V_{TH}$ of the program memory cell 224 may not be substantial. Thus, in the first comparative example A, it is necessary to input a substantially high program voltage $V_{PGM}$ for accurate programming, which may cause increased power consumption of a memory device.

In a second comparative example B, a difference between the rising point of the voltage $V_{SSL}$ of the string select line SSL and the rising point of the switch voltage $V_{SWL}$ may be 0.5 µs, which is longer compared to the first comparative example A. In the second comparative example B, when the program voltage $V_{PGM}$ of about 13 V is input, the threshold voltage $V_{TH}$ of the program memory cell 224 may rise to about 1 V. Thus, a more accurate program operation may be performed based on the same voltage level of the program voltage $V_{PGM}$, compared to the first comparative example A.

In a third comparative example C, a difference between the rising point of the voltage $V_{SSL}$ of the string select line SSL and the rising point of the switch voltage $V_{SWL}$ may be 0.7 µs, which is longer compared to the first comparative example A and the second comparative example B. In the third comparative example C, when the program voltage $V_{PGM}$ of about 13 V is input, the threshold voltage $V_{TH}$ of the program memory cell 224 may rise to about 3.5 V. Thus, a more accurate program operation may be performed based on the same voltage level of the program voltage $V_{PGM}$, compared to the first comparative example A and the second comparative example B.

In a fourth comparative example D, a difference between the rising point of the voltage $V_{SSL}$ of the string select line SSL and the rising point of the switch voltage $V_{SWL}$ may be 1.0 µs. Referring to a graph illustrating the fourth comparative example D in FIG. 8B, the threshold voltage $V_{TH}$ of the program memory cell 224 may rise to about 5.0 V in response to an input of the program voltage $V_{PGM}$ of about 13 V.

As can be seen from the first comparative example A to the fourth comparative example D, as the time difference between the rising point of the voltage $V_{SSL}$ of the string select line SSL and the rising point of the switch voltage $V_{SWL}$ is increased, the threshold voltage $V_{TH}$ of the program memory cell 224 may be increased at a greater rate in response to the same voltage level of the program voltage $V_{PGM}$. As the time difference between the rising point of the voltage $V_{SSL}$ of the string select line SSL and the rising point of the switch voltage $V_{SWL}$ is increased, the probability of the generation of a hot carrier in the first channel region CH1 is increased, and a magnitude of the program voltage $V_{PGM}$ required to sufficiently increase the threshold voltage $V_{TH}$ of the program memory cell 224 may be reduced. Thus, power consumption of a memory device may be lowered. In addition, as the threshold voltage $V_{TH}$ of the program memory cell 224 is increased at a greater rate in response to the same voltage level of the program voltage $V_{PGM}$, interference occurring in a program operation may be reduced.

Figure 12:
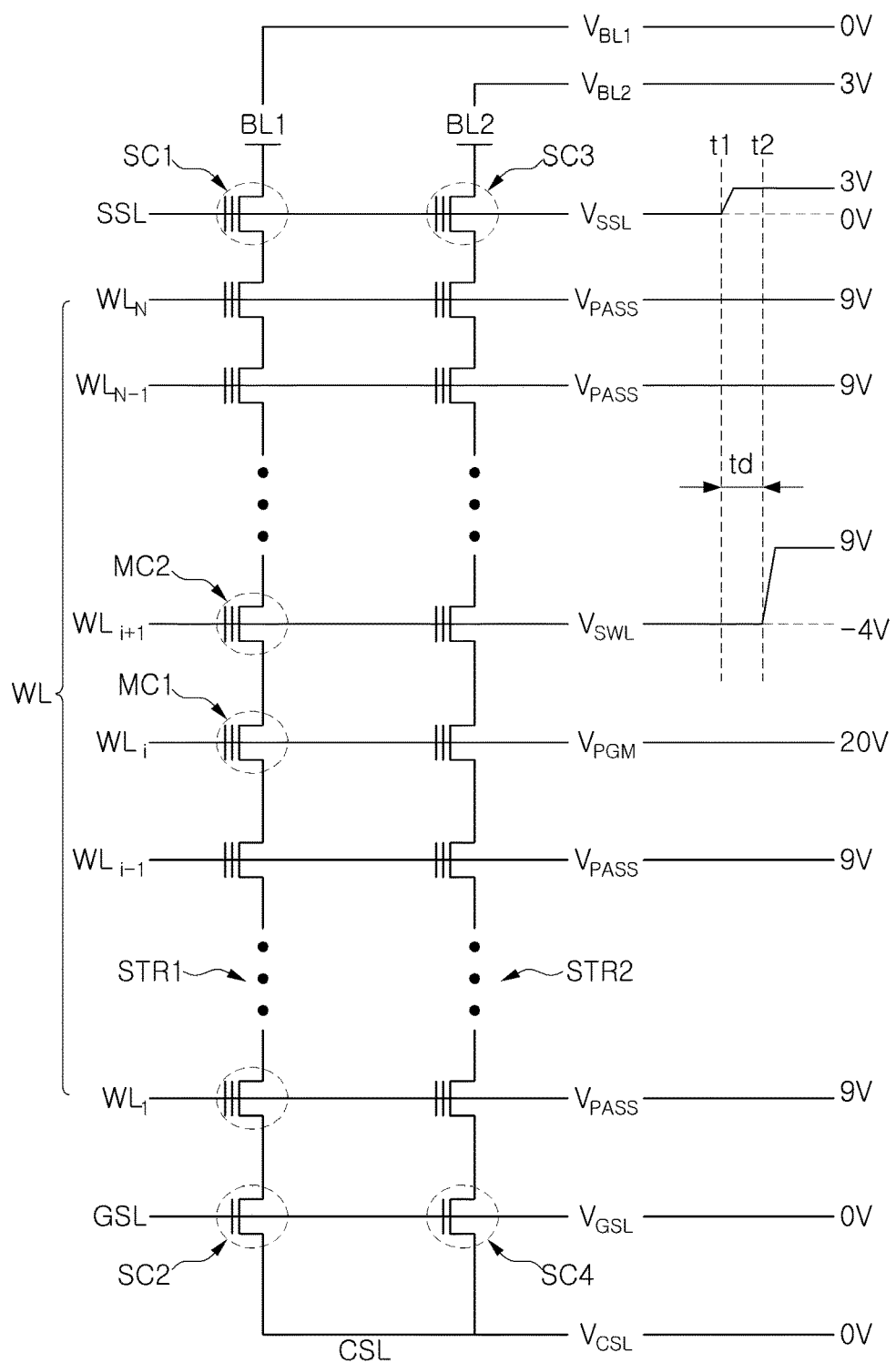
FIGS. 12 and 13 are drawings provided to illustrate operations of a memory device according to an example embodiment.
Figure 13:
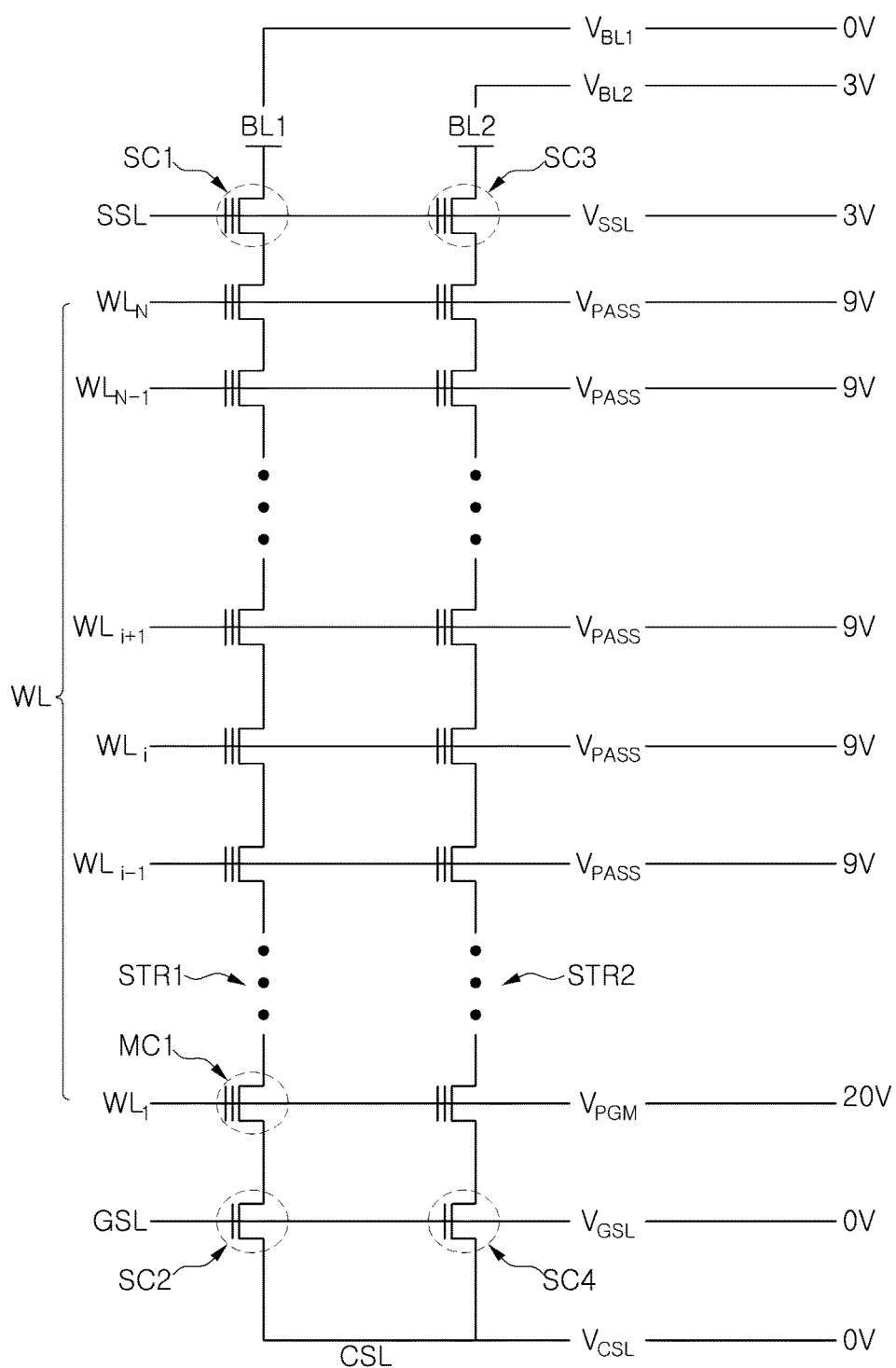

FIGS. 12 and 13 are drawings provided to illustrate an operation of a memory device according to an example embodiment.

A memory device according to an example embodiment may be a vertical type memory device, and may include a channel region extended in a direction perpendicular to an upper surface of a semiconductor substrate, and a plurality of word lines stacked on the semiconductor substrate to be adjacent to the channel region. A first select line may be provided between the plurality of word lines and the semiconductor substrate, and a second select line may be provided in an upper portion of the plurality of word lines.

Referring to FIGS. 12 and 13, a memory device according to an example embodiment may include a first memory cell string STR1 and a second memory cell string STR2. The first memory cell string STR1 and the second memory cell string STR2 may share word lines WL (e.g., $WL_1, \ldots WL_{i-1}, WL_i, WL_{i+1}, \ldots WL_{N-1}$, and $WL_N$) and the common source line CSL. Each of the first memory cell string STR1 and the second memory cell string STR2 may be connected to a first bit line BL1 and a second bit line BL2.

The plurality of word lines WL may be connected to a plurality of memory cells, and the plurality of memory cells may be connected to each other in series. Both ends of the plurality of memory cells connected to each other in series may be connected to a first switch cell SC1 and a second switch cell SC2, respectively. Referring to the first memory cell string STR1, the first switch cell SC1 may be connected to the first bit line BL1 and a first select line SSL, and the second switch cell SC2 may be connected to the common source line CSL and a second select line GSL. The first select line SSL may be a string select line, and the second select line GSL may be a ground select line.

In an example embodiment illustrated in FIG. 12, the control circuit may perform a program operation for a first memory cell MC1 connected to an i-th word line $WL_i$ located at an i-th position. The control circuit inputs the program voltage $V_{PGM}$ of about 20 V to the i-th word line $WL_i$, and inputs the switch voltage $V_{SWL}$ to an i+1-th word line $WL_{i+1}$ adjacent to the i-th word line $WL_i$. The switch voltage $V_{SWL}$ may have a magnitude varying while a program operation is performed. The pass voltage $V_{PASS}$ of about 9 V may be input to the remaining word lines except for the i-th word line $WL_i$ and the i+1-th word line $WL_{i+1}$. According to a voltage condition described above, each voltage of channel regions located in an upper portion and a lower portion of a second memory cell MC2 may be boosted.

While a program operation is performed, the control circuit may maintain voltages of the first bit line BL1, the common source line CSL, and the second select line GSL at a ground voltage. The control circuit may input a voltage of about 3 V to the second bit line BL2 connected to the second memory cell string STR2, which does not include the first memory cell MC1 to be programmed. The voltage $V_{BL2}$ input to the second bit line BL2 may be the same value as a threshold voltage of a first switch cell SC3 included in the second memory cell string STR2 or a value higher than the threshold voltage of the first switch cell SC3.

When a program operation is started and time t1 has elapsed, the control circuit increases a magnitude of the voltage $V_{SSL}$ input to the first select line SSL from the ground voltage to about 3V. In an example embodiment, the magnitude of the voltage $V_{SSL}$ input to the first select line SSL may be increased to have a value higher than a threshold voltage of the first switch cell SC1 included in the first memory cell string STR1. As the magnitude of the voltage $V_{SSL}$ input to the first select line SSL increases, the first switch cell SC1 is turned on and a hot carrier may be generated in an upper channel region located between the second memory cell MC2 and the first switch cell SC1.

Referring to FIG. 12, at time t2 after a predetermined time td has passed from the time t1, the control circuit may increase the switch voltage $V_{SWL}$. The switch voltage $V_{SWL}$ may be maintained at a first level of about −4V until the time t2, and the first level may be determined as an arbitrary value lower than a threshold voltage of the second memory cell MC2. When the time t2 arrives, the control circuit increases the switch voltage $V_{SWL}$ from a first level to a second level. In an example embodiment, the second level may be determined as an arbitrary value higher than the threshold voltage of the second memory cell MC2. In an example embodiment illustrated in FIG. 12, the second level may be the same level as the pass voltage $V_{PASS}$.

The control circuit maintains a magnitude of the switch voltage $V_{SWL}$ at a first level until the time t2, and thus prevents a hot carrier generated in an upper channel region located between the second memory cell MC2 and the first switch cell SC1 from moving to the first memory cell MC1. In other words, due to the switch voltage $V_{SWL}$ maintained at the first level until the time t2, the second memory cell MC2 may prevent a current from flowing. In addition, at the time t2 after the time td has passed, the switch voltage $V_{SWL}$ is increased, and a hot carrier may be sufficiently generated in an upper channel region during the time td. Thus, a program operation for the first memory cell MC1 may be performed accurately and efficiently.

A program operation may not be performed in the second memory cell string STR2 adjacent to the first memory cell string STR1. Referring to FIG. 12, while a program operation for the first memory cell MC1 is performed, the voltage $V_{BL2}$ of the second bit line BL2 connected to the second memory cell string STR2 may have the same value as a threshold voltage of the first switch cell SC3 included in the second memory cell string STR2 or may be maintained at a value higher than the threshold voltage of the first switch cell SC3. Thus, even when the voltage $V_{SSL}$ of the string select line SSL is increased at the time t1, a hot carrier may not be generated in a channel region of the second memory cell string STR2, and a program operation may not be performed.

Next, in an example embodiment illustrated in FIG. 13, the first memory cell MC1, for which a program operation is to be performed by the control circuit, may be located in a lowermost portion among memory cells included in the first memory cell string STR1. In other words, the first word line $WL_1$ connected to the first memory cell MC1 may be located in the lowermost portion among the word lines WL.

As in an example embodiment illustrated in FIG. 13, when the first memory cell MC1 to be programmed is close to the second select line GSL, a hot carrier generated in a channel region located in an upper portion of the first memory cell MC1 may not sufficiently move to the first memory cell MC1. Thus, when the first memory cell MC1, close to the second select line GSL, is a program target, the control circuit may perform a program operation for the first memory cell MC1 by using a Fowler-Nordheim (FN) tunneling method.

When the FN tunneling method is used, a switch word line is not required to be selected, and the program voltage $V_{PGM}$ is input to only the first word line WL1 connected to the first memory cell MC1, which is a program target. The pass voltage $V_{PASS}$ may be input to the remaining word lines. While the first switch cell SC1 included in the first memory cell string STR1 is turned on and the second switch cell SC2 included in the first memory cell string STR1 is turned off, the first switch cell SC3 and a second switch cell SC4 included in the second memory cell string STR2 may be turned off.

As described with reference to FIGS. 12 and 13, in an example embodiment, depending on a location of the first memory cell MC1 to be programmed, an FN tunneling method and a hot carrier injection method may be used together. In an example embodiment, when the first memory cell MC1 is close to the first switch cell SC1, a program operation is performed by using the hot carrier injection method. When the first memory cell MC1 is close to the second switch cell SC2, a program operation is performed by using the FN tunneling method. For example, when the number of memory cells located between the first memory cell MC1 and the first switch cell SC1 is greater than the number of memory cells located between the first memory cell MC1 and the second switch cell SC2, a program operation for the first memory cell MC1 may be performed by using the FN tunneling method. Alternatively, when the number of memory cells located between the first memory cell MC1 and the first switch cell SC1 is greater than a predetermined threshold number, a program operation for the first memory cell MC1 may be performed by using the FN tunneling method. Also, according to an example embodiment, when the number of memory cells located between the first memory cell MC1 and the first switch cell SC1 is less than the number of memory cells located between the first memory cell MC1 and the second switch cell SC2, a program operation for the first memory cell MC1 may be performed by using the hot carrier injection method. Alternatively, when the number of memory cells located between the first memory cell MC1 and the first switch cell SC1 is less than a predetermined threshold number, a program operation for the first memory cell MC1 may be performed by using the hot carrier injection method.

Figure 14:
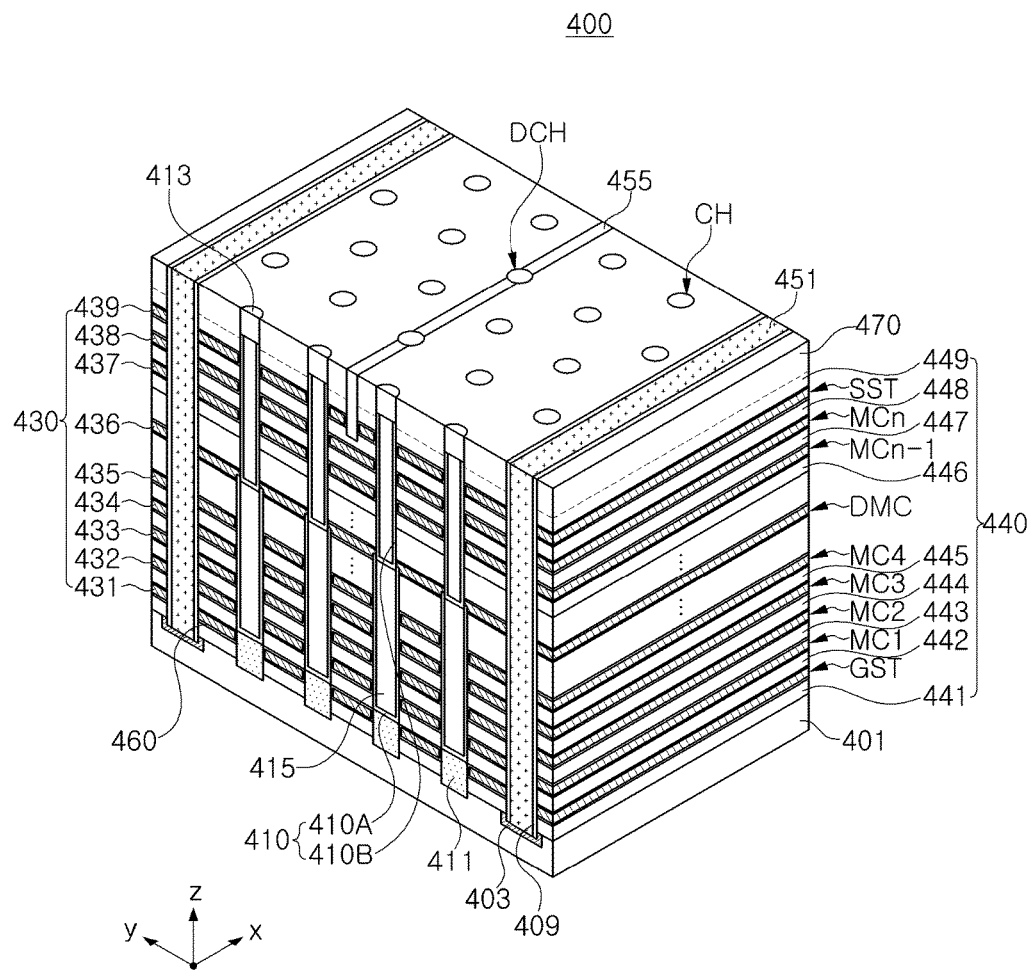
FIG. 14 is a perspective view illustrating a memory device according to an example embodiment.

FIG. 14 is a perspective view illustrating a memory device according to an example embodiment.

FIG. 14 is a perspective view illustrating a cell region of a memory device. Referring to FIG. 14, a memory device 400 according to an example embodiment may include a substrate 401, a plurality of channel structures CH and dummy channel structures DCH perpendicular to an upper surface (or an X-Y plane in an example embodiment illustrated in FIG. 14) of the substrate 401, a plurality of gate electrode layers 430 (e.g., gate electrode layers 431, 432, 433, 434, 435, 436, 437, 438, and 439) stacked on the substrate 401 to be adjacent to the channel structure CH, and the like. The plurality of gate electrode layers 430 may be alternately stacked with a plurality of insulating layers 440 (e.g., insulating layers 441, 442, 443, 444, 445, 446, 447, 448, and 449), and at least a portion of the gate electrode layers 439 may be divided into a plurality of portions by an isolation insulating layer 455.

In an example embodiment illustrated in FIG. 14, a channel region 410 may include a lower channel region 410A and an upper channel region 410B. The lower channel region 410A may be connected to the upper channel region 410B. A gate electrode layer 436 adjacent to a boundary between the lower channel region 410A and the upper channel region 410B may provide a dummy memory cell DMC. In the dummy memory cell DMC, operations such as programming, reading, erasing, and the like may not be performed, which is different from other memory cells MC1, MC2, MC3, MC4, . . . MCn−1, and MCn.

Other components except for the channel region 410 and the dummy memory cell DMC may be similar to those of the memory device 100 illustrated in FIG. 3. The gate electrode layers 430 may be divided in to a plurality of regions by a common source line 451 and a side spacer 409, and the common source line 451 may be connected to a source region 403 formed in the substrate 401. A gate insulating layer 460 may be formed between the channel region 410 and the gate electrode layers 430. The gate insulating layer 460 may have a plurality of layers, and at least a portion of the layers of the gate insulating layer 460 may be formed in an outer side surface of the channel region 410.

Figure 15:
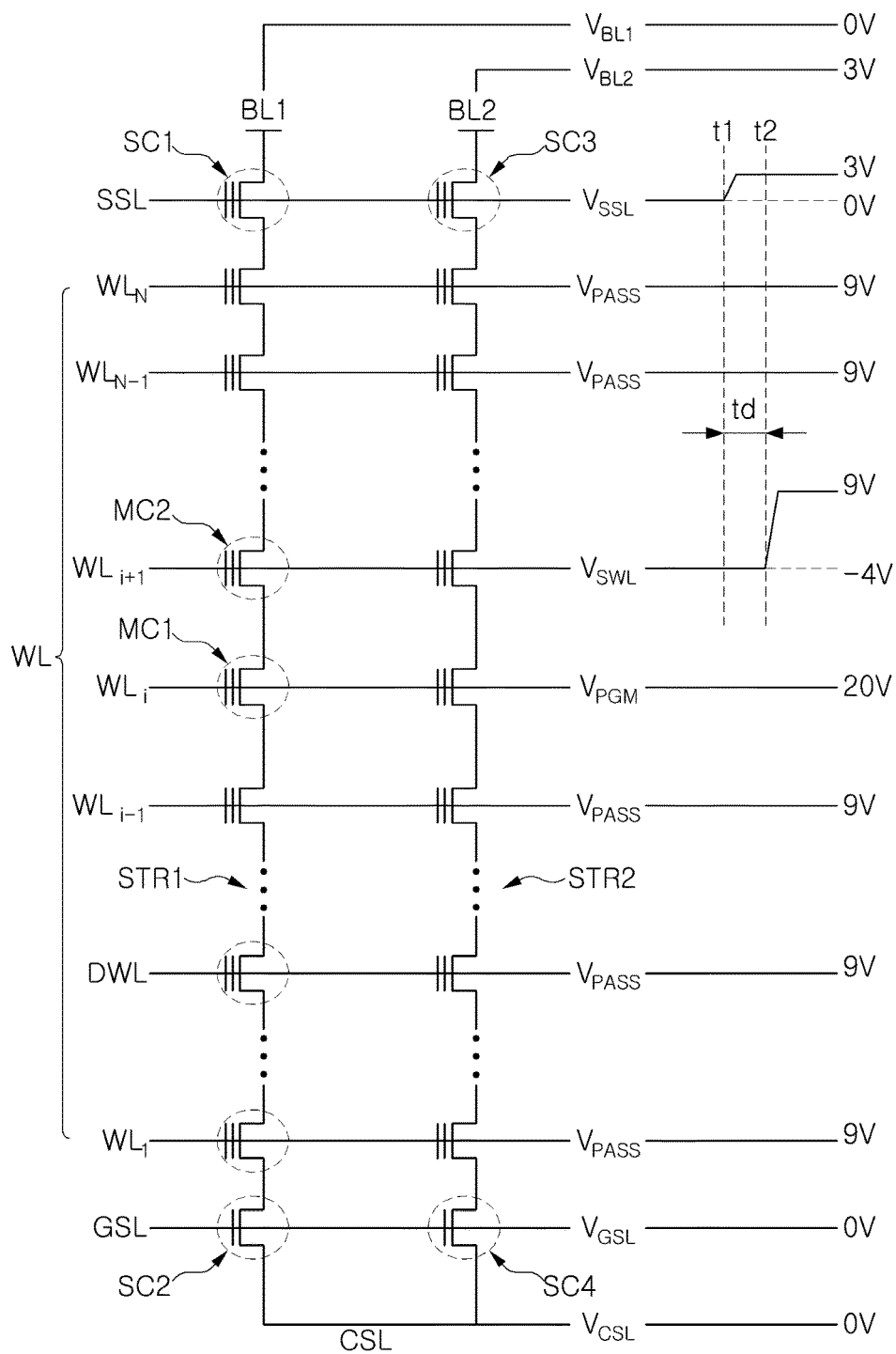
FIG. 15 is a drawing provided to illustrate operations of a memory device according to an example embodiment.

FIG. 15 is a drawing provided to illustrate an operation of a memory device according to an example embodiment.

In an example embodiment illustrated in FIG. 15, the control circuit may perform a program operation for the first memory cell MC1 connected to an i-th word line $WL_i$ located at an i-th position. The control circuit inputs the program voltage $V_{PGM}$ of about 20 V to the i-th word line $WL_i$, and inputs the switch voltage $V_{SWL}$ to an i+1-th word line $WL_{i+1}$ adjacent to the i-th word line $WL_i$. The switch voltage $V_{SWL}$ may have a magnitude that varies while a program operation is performed. The pass voltage $V_{PASS}$ of about 9 V may be input to the remaining word lines $WL_1, \ldots WL_i, \ldots WL_{N-1}$ $WL_N$ except for the i-th word line $WL_i$ and the i+1-th word line $WL_{i+1}$. According to voltage conditions described above, each voltage of channel regions located in an upper portion and a lower portion of the second memory cell MC2 may be boosted.

While the program operation is performed, the control circuit may maintain voltages of the first bit line BL1, the common source line CSL, and the second select line GSL at a ground voltage. The control circuit may input a voltage of about 3 V to the second bit line BL2 connected to the second memory cell string STR2 that does not include the first memory cell MC1 to be programmed. In other words, the voltage $V_{BL2}$ input to the second bit line BL2 may be determined to the same value as a threshold voltage of the first switch cell SC3 included in the second memory cell string STR2 or a value higher than the threshold voltage of the first switch cell SC3.

When a program operation is started and time t1 has elapsed, the control circuit increases a magnitude of the voltage $V_{SSL}$ input to the first select line SSL from a ground voltage to about 3 V, and thus allows the first switch cell SC1 to be turned on. In this case, the first switch cell SC3 included in the second memory cell string STR2 may not be turned on by the voltage $V_{BL2}$ input to the second bit line BL2.

Referring to FIG. 15, at time t2 after a predetermined time td has passed from the time t1, the control circuit may increase the switch voltage $V_{SWL}$. When the time t2 arrives, the control circuit increases the switch voltage $V_{SWL}$ from a first level to a second level. In an example embodiment, the second level may be determined as an arbitrary value higher than a threshold voltage of the second memory cell MC2. In an example embodiment illustrated in FIG. 15, the second level may be the same level as the pass voltage $V_{PASS}$.

The control circuit maintains a magnitude of the switch voltage $V_{SWL}$ at a first level until the time t2, and thus prevents a hot carrier generated in an upper channel region located between the second memory cell MC2 and the first switch cell SC1 from moving to the first memory cell MC1. In other words, due to the switch voltage $V_{SWL}$ maintained at the first level until the time t2, the second memory cell MC2 may prevent a current from flowing. In addition, at the time t2 after the time td has passed, the switch voltage $V_{SWL}$ is increased, and a hot carrier may be sufficiently generated in the upper channel region during the time td. Thus, a program operation for the first memory cell MC1 may be performed accurately and efficiently.

In an example embodiment illustrated in FIG. 15, a voltage input to a dummy word line DWL may be the pass voltage $V_{PASS}$. The dummy word line DWL may be a word line adjacent to a boundary between the lower channel region 410A and the upper channel region 410B formed in a separated process. In an example embodiment, in the dummy word line DWL, a program operation may not be performed. In other words, the dummy word line DWL may not provide a memory cell.

Moreover, in an example embodiment illustrated in FIG. 15, in a memory cell provided by word lines located below the dummy word line DWL, a program operation may be performed by using an FN tunneling method rather than a hot carrier method. As a memory cell is closer to the common source line CSL, a program voltage required in the program operation using the FN tunneling method may be smaller. Thus, in an example embodiment illustrated in FIG. 15, with respect to word lines located below the dummy word line DWL, the program operation may be performed by using the FN tunneling method.

Figure 16:
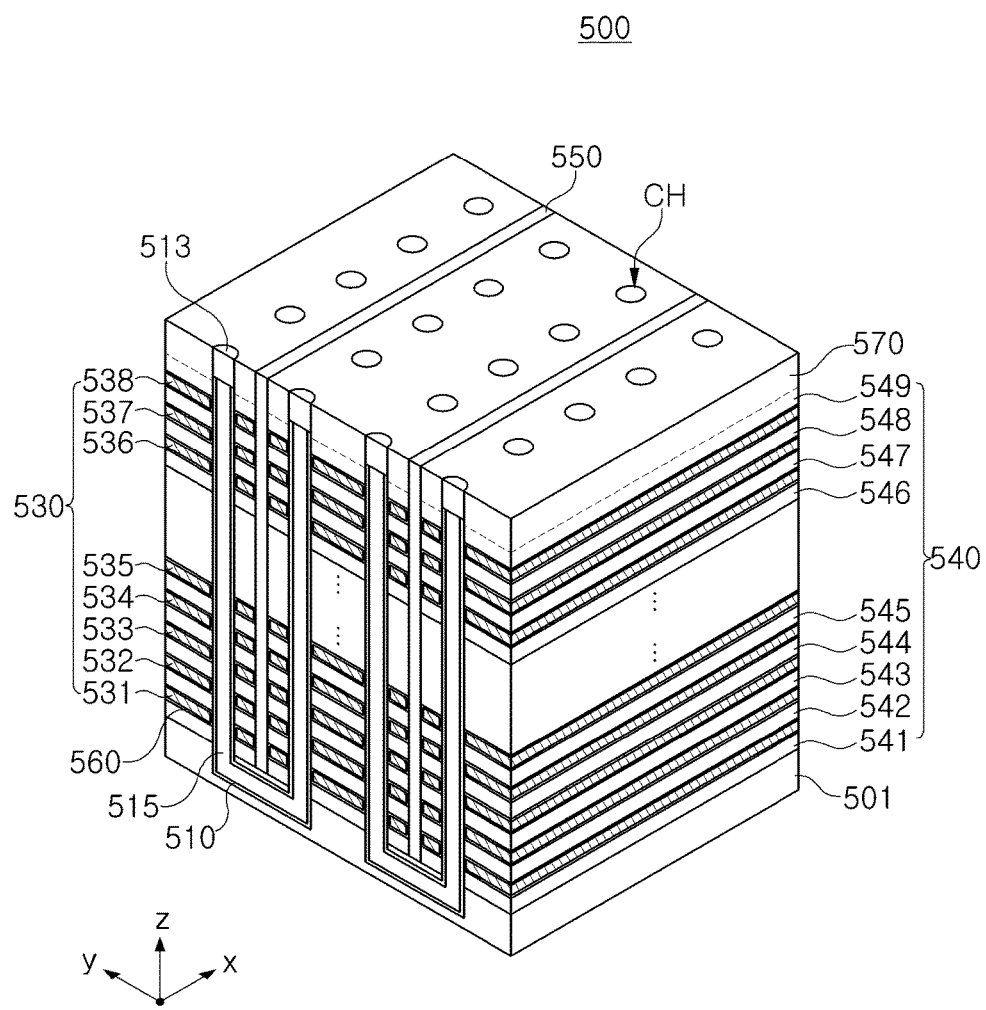
FIGS. 16 and 17 are drawings illustrating a memory device according to an example embodiment.
Figure 17:
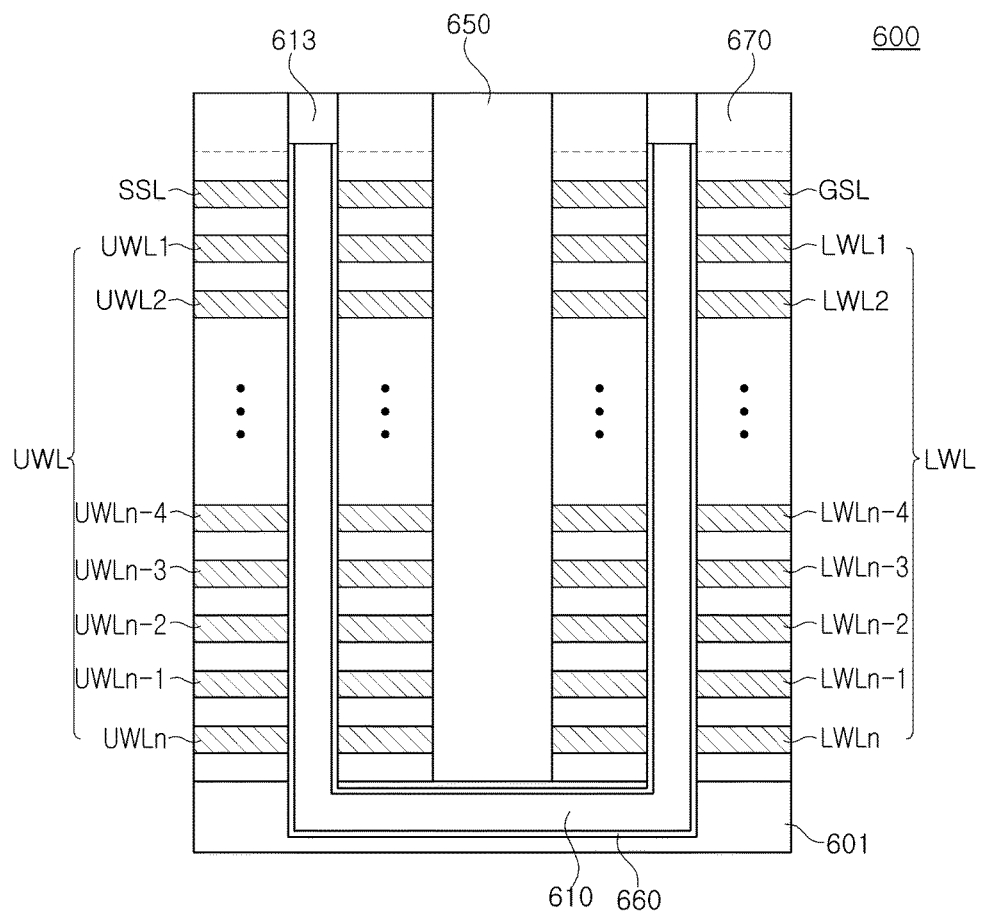

FIGS. 16 and 17 are drawings illustrating a memory device according to an example embodiment.

Memory devices 500 and 600 according to example embodiments illustrated in FIGS. 16 and 17, a source region may have a structure in which substrates 501 and 601 are not formed. Thus, channel regions 510 and 610 may have a U-shape, and a drain region of string select transistor and a source region of a ground select transistor may be provided by conductive layers 513 and 613 formed in both ends of the channel regions 510 and 610, respectively.

Referring to FIG. 16, a plurality of gate electrode layers 530 (e.g., gate electrode layers 531, 532, 533, 534, 535, 536, 537, and 538) and a plurality of insulating layers 540 (e.g., insulating layers 541, 542, 543, 544, 545, 546, 547, 548, and 549) may be alternately stacked, and an interior of the channel region 510 may be filled with an embedded insulating layer 515. A gate insulating layer 560 may be formed between the gate electrode layers 530 and the channel region 510, and at least one of a plurality of layers included in the gate insulating layer 560 may be formed on an outer side surface of the channel region 510.

The gate electrode layers 530 may be divided into a plurality of regions by an isolation insulating layer 550. In an example embodiment, the isolation insulating layer 550 may be provided in the channel region 510 that is bent to have the U-shape. Thus, the memory device 500 may be implemented to allow a single channel region 510, which is bent to have the U-shape, to be adjacent to the gate electrode layers 530 that are divided into the plurality of regions.

Next, referring to FIG. 17, gate electrode layers are divided into a plurality of regions by an isolation insulating layer 650, thereby providing a plurality of word lines UWL and DWL. In an example embodiment, upper word lines UWL (e.g., upper word lines UWL1, UWL2, . . . UWLn−4, UWLn−3, UWLn−2, UWLn−1, and UWLn) may be provided below the string select line SSL, and lower word lines LWL (e.g., lower word lines LWL1, LWL2, . . . LWLn−4, LWLn−3, LWLn−2, LWLn−1, and LWLn) may be provided below the ground select line GSL. The upper word lines UWL and the lower word lines LWL are separated from each other by the isolation insulating layer 650, thereby providing memory cells which are different from each other. In an example embodiment illustrated in FIG. 17, the channel region 610 may have a cylindrical shape and bent to have the U-shape, and a gate insulating layer 660 may be provided on an outer side surface of the channel region 610.

Figure 18:
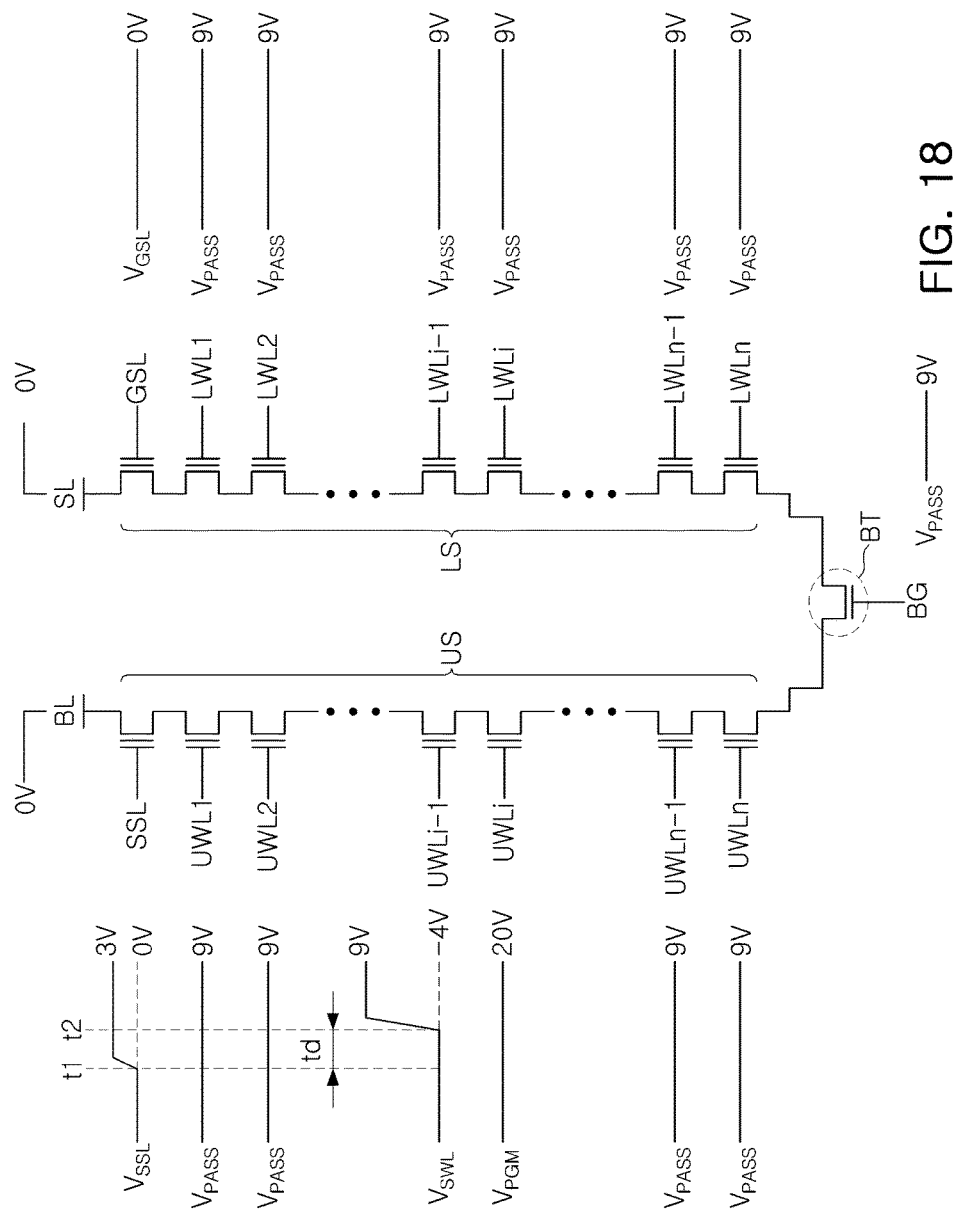
FIG. 18 is a drawing provided to illustrate operations of a memory device according to an example embodiment.

FIG. 18 is a drawing provided to illustrate an operation of a memory device according to an example embodiment. In an example embodiment, a program operation of a memory device, illustrated with reference to FIG. 18, may be performed by a control circuit of the memory device, and may be applied to the memory devices 500 and 600 according to example embodiments illustrated in FIGS. 16 and 17.

Referring to FIG. 18, an upper string US including the upper word lines UWL1 to UWLn may be connected between a bit line BL and a back transistor BT, and a lower string LS including the lower word lines LWL1 to LWLn may be connected between a source line SL and the back transistor BT. The back transistor BT may be a transistor provided by the channel regions 510 and 610 embedded in the substrates 501 and 601 in the memory devices 500 and 600, respectively.

In an example embodiment illustrated in FIG. 18, a program word line connected to a memory cell to be programmed may be an i-th upper word line UWLi. The control circuit may select an i+1-th upper word line UWLi+1 as a switch word line. The control circuit may input the pass voltage $V_{PASS}$ to other word lines except for the i-th upper word line UWLi, which is the program word line, and the i+1-th upper word line UWLi+1, which is the switch word line. In this case, the pass voltage $V_{PASS}$ may be input to a back gate terminal BG that determines the on/off state of the back transistor BT.

The control circuit increases the voltage $V_{SSL}$ input to the string select line SSL at time t1, and thus allows a string select transistor to be turned on, thereby forming a hot carrier. After a predetermined time td has passed from the time t1, the control circuit increases the switch word line UWLi+1, and thus allows the hot carrier to pass through a channel region adjacent to the switch word line UWLi+1. The hot carrier may be trapped in a charge storage layer located between the program word line UWLi and the channel region by the program voltage $V_{PGM}$ input to the program word line UWLi.

In an example embodiment illustrated in FIG. 18, a program operation using a hot carrier may be applied to memory cells included in the upper string US. A program operation using an FN tunneling method may be applied to memory cells included in the lower string LS.

Figure 19:
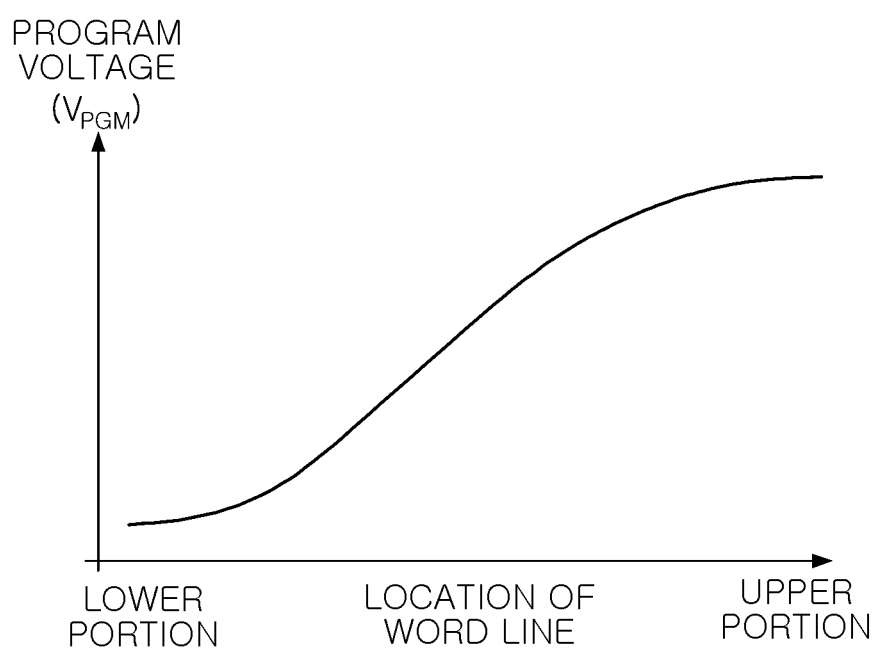
FIG. 19 is a drawing provided to illustrate the relationship between a program operation of a memory device according to an example embodiment and a word line.

FIG. 19 is a drawing provided to illustrate the relationship between a program operation of a memory device according to an example embodiment and a word line.

FIG. 19 is a graph illustrating the program voltage $V_{PGM}$ depending on a location of a memory cell, when a program operation is performed using an FN tunneling method. Referring to FIG. 19, when a memory cell to be programmed is located in a lower portion of a memory cell string, that is, in a portion closer to a common source line, a program operation using an FN tunneling method may be performed based on a low program voltage $V_{PGM}$. On the other hand, when the memory cell to be programmed is located in an upper portion of a memory cell string, that is, in a portion closer to a bit line, a high program voltage $V_{PGM}$ may be required to perform a program operation using an FN tunneling method.

In an example embodiment, the control circuit may perform a program operation using a hot carrier injection method when the memory cell to be programmed is located in an upper portion of a memory cell string. Therefore, an effect of reducing the program voltage $V_{PGM}$ may be obtained. As a program operation using a hot carrier injection method proposed in an example embodiment is applied to a memory cell in an upper portion, in which a high program voltage $V_{PGM}$ is required to perform a program operation using an FN tunneling method according to the related art, an effect of reducing the program voltage $V_{PGM}$ may be substantially increased. An FN tunneling method according to the related art may be applied to a memory cell in a lower portion, close to a common source line, in consideration of a current generated due to hot carrier injection, or the like.

Figure 20A:
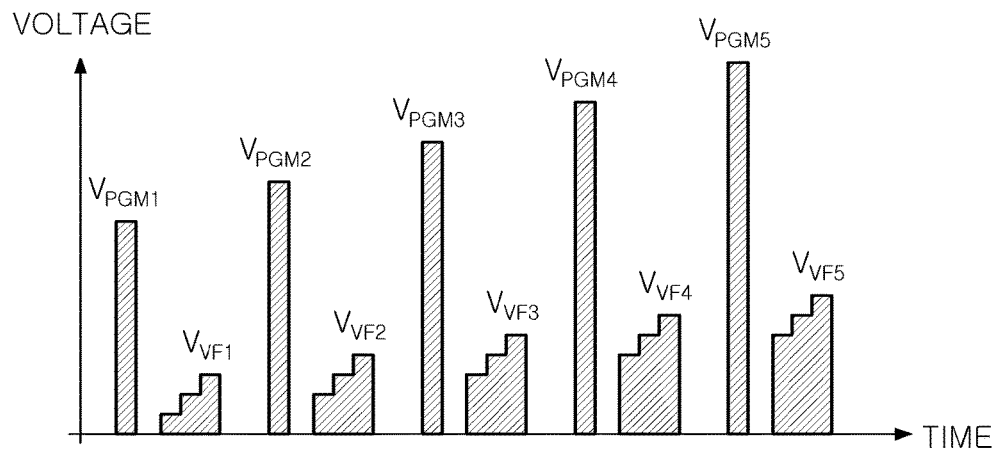
FIGS. 20A and 20B are drawings provided to illustrate a program operation of a memory device according to an example embodiment.
Figure 20B:
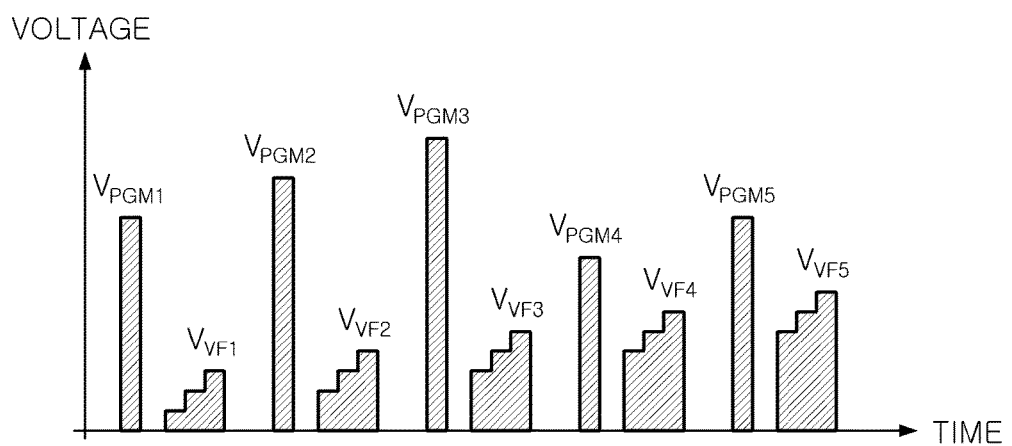

FIGS. 20A and 20B are drawings provided to illustrate a program operation of a memory device according to an example embodiment.

FIG. 20A is a graph illustrating a program operation of an FN tunneling method according to the related art. In a program operation according to an example embodiment illustrated in FIG. 20A, a program voltage may be applied in an increment step pulse programming (ISPP) scheme. In other words, as illustrated in FIG. 20A, a program voltage may gradually increase as program loops are repeated.

Referring to FIG. 20A, after a program operation is performed by a first program voltage $V_{PGM1}$, memory cells having a lower threshold voltage than a first verify voltage $V_{VF1}$ may be identified by using the first verify the voltage $V_{VF1}$. Thereafter, when a second program loop comes, a program operation may be performed by a second program voltage $V_{PGM2}$ that is higher than the first program voltage $V_{PGM1}$. In the second program loop, a program operation for a memory cell string including a memory cell having a threshold voltage lower than the first verify voltage $V_{VF1}$ may be performed. Thus, as illustrated in FIG. 20A, in a program operation using an FN tunneling method according to the related art, as a program loop proceeds, a program voltage gradually increases, and an increase in power consumption of a memory device may be caused.

Next, referring to FIG. 20B, a program operation using a hot carrier injection method according to an example embodiment may be applied to at least a portion of program loops according to the ISPP scheme. In an example embodiment, a program operation using a hot carrier injection method according to an example embodiment is applied to program loops that require a relatively high program voltage. Therefore, according to an example embodiment, power consumption of a memory device may be reduced.

As described above, according to a program operation according to an example embodiment, based on a switch memory cell adjacent to a program memory cell to be programmed, a voltage of a channel region may be boosted at both sides of the switch memory cell. When the voltage of the channel region is boosted, a first switch cell connected to a bit line is turned on, and a hot carrier is generated in a channel region located in one side of the switch memory cell. Thereafter, as a voltage of the switch word line is increased, a current due to the hot carrier is controlled to flow through a program memory cell. Thus, a program voltage input to a program word line connected to the program memory cell may be reduced compared to an FN tunneling method according to the related art, which may reduce power consumption of a memory device.

Figure 21:
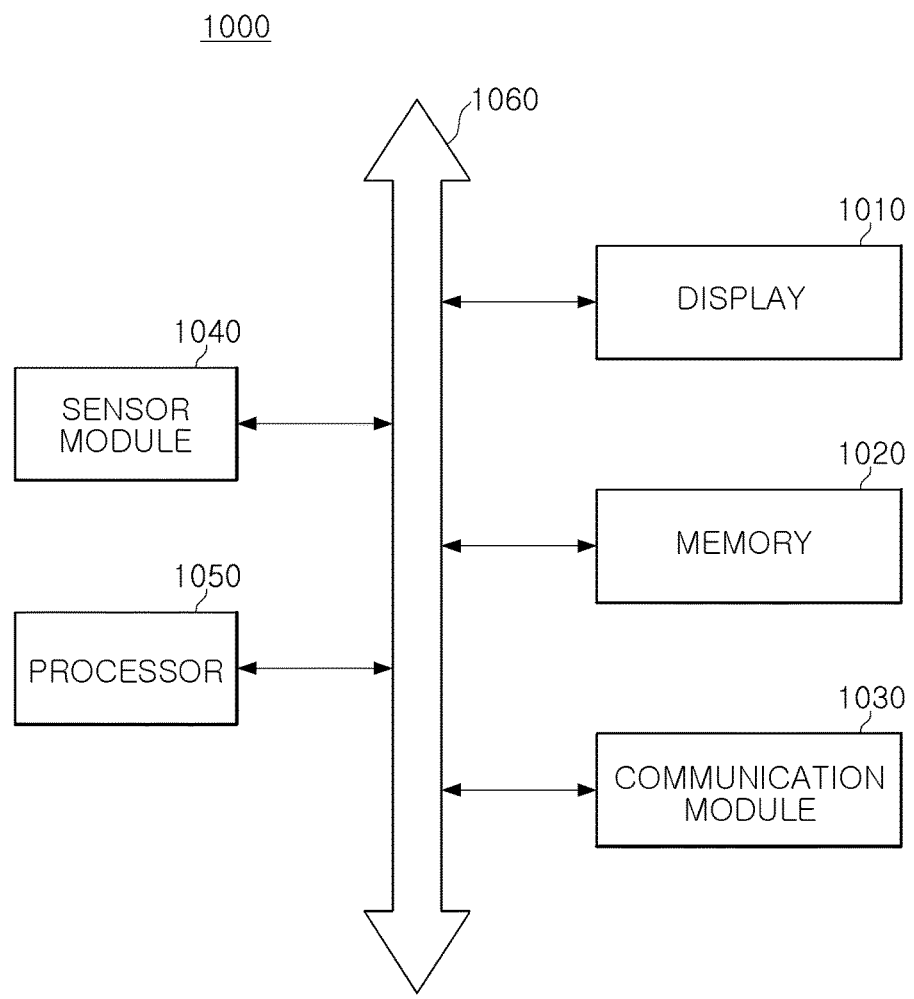
FIG. 21 is a block diagram illustrating an electronic device including a short-range wireless communication device according to an example embodiment.

FIG. 21 is a block diagram illustrating an electronic device including a short-range wireless communication device according to an example embodiment.

Referring to FIG. 21, an electronic device 1000 according to an example embodiment may include a display 1010, a memory 1020, a communication module 1030, a sensor module 1040, a processor 1050, and the like. The electronic device 1000 may include a television, a desktop computer, and the like, in addition to a mobile device, such as a smartphone, a tablet personal computer (PC), a laptop computer, and the like. Components such as the display 1010, the memory 1020, the communication module 1030, the sensor module 1040, the processor 1050, and the like may communicate with each other through a bus 1060.

The memory 1020 receives a command transmitted from the processor 1050 through the bus 1060, thereby performing operations such as programming, reading, erasing, and the like. The memory 1020 may include a NAND type flash memory device, and may write data to a memory cell in a program operation using an FN tunneling method and a program operation using a hot carrier injection method. One of an FN tunneling method and a hot carrier injection method is selectively applied based on various conditions. In an example embodiment, one of the FN tunneling method and the hot carrier injection method may be selectively applied according to a location of a memory cell to which data is to be written. In another example embodiment, one of the FN tunneling method and the hot carrier injection method may be selectively applied according to an order of a program loop depending on the ISPP scheme.

As set forth above, according to example embodiments, after a channel region is boosted, turn-on voltages are sequentially input to a switch cell connected to a bit line and a switch word line. Thus, in a program operation using hot carrier injection (HCI), a program voltage may be reduced, and an interference phenomenon between memory cells may be reduced. Additionally, according to a condition of a memory cell to be programmed, a hot carrier injection method and an FN tunneling method are used together, and therefore, reliability of a program operation may be improved.

While example embodiments have been shown and described above, it will be apparent to those skilled in the art that modifications and variations could be made without departing from the scope of the present disclosure, as defined by the appended claims.

What is claimed is:

1. A memory device, comprising:
a memory cell array including a first switch cell, a second switch cell, and a plurality of memory cells, the plurality of memory cells disposed between the first switch cell and the second switch cell and connected to a plurality of word lines; and
a control circuit configured to perform a program operation by providing a program voltage to a first word line among the plurality of word lines, a switch voltage to a second word line among the plurality of word lines, and a pass voltage to remaining word lines among the plurality of word lines,
wherein the control circuit is configured to turn off the first switch cell and the second switch cell in a first section of the program operation, and configured to turn on the first switch cell and increase the switch voltage in a second section of the program operation later than the first section.

2. The memory device of claim 1, wherein the first word line is connected to a first memory cell, and the second word line is connected to a second memory cell adjacent to the first memory cell.

3. The memory device of claim 2, wherein the second word line is adjacent to the first word line and disposed above the first word line.

4. The memory device of claim 2, wherein the switch voltage is maintained in the first section at a first level that is lower than a threshold voltage of the second memory cell, and increased in the second section to a second level that is higher than the threshold voltage of the second memory cell.

5. The memory device of claim 2, wherein the second memory cell is disposed between the first memory cell and the first switch cell.

6. The memory device of claim 1, wherein the first switch cell is connected to a bit line and a first select line, and the second switch cell is connected to a common source line and a second select line.

7. The memory device of claim 6, wherein the control circuit is configured to provide a ground voltage to the common source line and the second select line during the first section and the second section.

8. The memory device of claim 6, wherein the control circuit is configured to provide a ground voltage to the bit line and the first select line during the first section, and provide a voltage higher than a threshold voltage of the second switch cell to the first select line during the second section.

9. The memory device of claim 6, wherein the control circuit is configured to, in the second section, increase the switch voltage in response to a voltage provided to the first select line being higher than a threshold voltage of the second switch cell.

10. The memory device of claim 1, wherein a number of first word lines between the first word line and the first switch cell is less than a number of second word lines between the first word line and the second switch cell.

11. The memory device of claim 1, wherein a number of word lines between the first word line and the first switch cell is less than a predetermined threshold number.

12. A memory device, comprising:
a first switch cell connected to a first select line;
a second switch cell connected to a second select line;
a plurality of memory cells connected to each other in series between the first switch cell and the second switch cell, and connected to a plurality of word lines; and
a control circuit configured to perform a program operation with respect to a program memory cell among the plurality of memory cells,
wherein the control circuit is configured to, in the program operation with respect to the program memory cell, provide a first turn-on voltage to the first select line and sequentially provide a second turn-on voltage to a switch word line among the plurality of word lines, the switch word line being connected to a switch memory cell adjacent to the program memory cell.

13. The memory device of claim 12, wherein a first magnitude of the first turn-on voltage provided to the first select line is different from a second magnitude of the second turn-on voltage provided to the switch word line.

14. The memory device of claim 12, wherein the first switch cell is connected to a bit line, and the second switch cell is connected to a common source line.

15. The memory device of claim 12, wherein the control circuit is configured to provide a program voltage to a program word line connected to the program memory cell, and provide a pass voltage to remaining word lines among the plurality of word lines except for the program word line and the switch word line, during the program operation.

16. The memory device of claim 15, wherein the second turn-on voltage provided to the switch word line is the same as the pass voltage.

17. The memory device of claim 15, wherein the control circuit is configured to provide the program voltage and the pass voltage to boost a first voltage of a first channel region located between the switch memory cell and the first switch cell and a second voltage of a second channel region located between the switch memory cell and the second switch cell.

18. The memory device of claim 15, wherein the control circuit is configured to provide a turn-off voltage to each of the first select line and the switch word line, before the first turn-on voltage and the second turn-on voltage are sequentially input to the first select line and the switch word line, respectively.

19. The memory device of claim 18, wherein the turn-off voltage provided to the first select line is higher than the turn-off voltage provided to the switch word line.

20. A memory device, comprising:
a channel region extended in a direction perpendicular to an upper surface of a semiconductor substrate;
a plurality of word lines stacked on the semiconductor substrate to surround the channel region, and including a program word line and a switch word line located above the program word line;
a ground select line between the plurality of word lines and the semiconductor substrate;
a string select line above the plurality of word lines; and
a control circuit configured to boost a voltage of the channel region located in each of an upper portion and a lower portion of the switch word line by providing a ground voltage to the ground select line and the string select line, providing a program voltage to the program word line, providing a switch voltage at a first level to the switch word line, and providing a pass voltage to remaining word lines of the plurality of word lines,
wherein the control circuit is configured to perform a program operation with respect to a memory cell connected to the program word line by increasing the switch voltage to a second level higher than the first level, after a voltage of the string select line is increased.

* * * * *